United States Patent
Tanimola

(10) Patent No.: US 11,479,466 B2
(45) Date of Patent: Oct. 25, 2022

(54) METHODS FOR SYNTHESIS OF GRAPHENE DERIVATIVES AND FUNCTIONAL MATERIALS FROM ASPHALTENES

(71) Applicant: Olanrewaju W. Tanimola, Houston, TX (US)

(72) Inventor: Olanrewaju W. Tanimola, Houston, TX (US)

( * ) Notice: Subject to any disclaimer, the term of this patent is extended or adjusted under 35 U.S.C. 154(b) by 556 days.

(21) Appl. No.: 14/822,822

(22) Filed: Aug. 10, 2015

(65) Prior Publication Data
US 2016/0039678 A1    Feb. 11, 2016

Related U.S. Application Data

(60) Provisional application No. 62/035,140, filed on Aug. 8, 2014.

(51) Int. Cl.
| | | |
|---|---|---|
| *C01B 32/168* | (2017.01) | |
| *C01B 32/194* | (2017.01) | |
| *C01B 32/156* | (2017.01) | |
| *C30B 7/14* | (2006.01) | |
| *C30B 29/02* | (2006.01) | |

(Continued)

(52) U.S. Cl.
CPC .......... *C01B 32/168* (2017.08); *C01B 32/156* (2017.08); *C01B 32/194* (2017.08); *C30B 7/06* (2013.01); *C30B 7/14* (2013.01); *C30B 29/02* (2013.01); *C30B 29/60* (2013.01)

(58) Field of Classification Search
CPC ... C01B 32/194; C01B 32/168; C01B 32/152; C01B 32/05; C30B 29/02; C30B 7/14; C30B 7/06; C30B 29/60
See application file for complete search history.

(56) References Cited

PUBLICATIONS

Pumera, Martin, and Colin Hong An Wong. "Graphane and hydrogenated graphene." Chemical Society Reviews 42.14 (2013): 5987-5995.*

(Continued)

*Primary Examiner* — Richard M Rump

(57) ABSTRACT

Embodiments described are directed to methods for the functionalization of asphaltene materials and to compositions made from functionalized asphaltenes. Disclosed is a method for synthesizing graphene derivatives, such as 2D single crystalline carbon allotropes of graphene and functional materials, such as sulfonic acid and its derivatives. Also disclosed is a method for the transformation of asphaltene into a source of graphene derivatives and functional materials, such as, 0D, 1D, 2D and combinations of 0D and 1D by utilizing chemical substitution reaction mechanism, such as, electrophilic aromatic substitution, nucleophilic aromatic substitution and Sandmeyer mechanism. Also disclosed are novel graphene materials comprising: acetylenic linkage and hydrogenated graphene. These novel materials, which may be produced by these methods, include, e.g.: 2D single crystalline carbon allotropes of graphene with asymmetric unit formulas $C_7H_6N_2O_4$, $C_6H_4N_2O_4$, $C_7H_7O_3S-H_3O+$, $C_7H_7O_3SH+$, and a 2D single crystal with asymmetric unit formula $(Na_6O_{16}S_4)n$.

44 Claims, 17 Drawing Sheets

(51) Int. Cl.
*C30B 7/06* (2006.01)
*C30B 29/60* (2006.01)

(56) References Cited

PUBLICATIONS

Sofo, Jorge O., Ajay S. Chaudhari, and Greg D. Barber. "Graphane: A two-dimensional hydrocarbon." Physical Review B 75.15 (2007): 153401.*

Longuinhos, Raphael, et al. "Theoretical chemistry of α-graphyne: functionalization, symmetry breaking, and generation of dirac-fermion mass." Chemistry of Materials 26.12 (2014): 3701-3708.*

Szostak, M. Magdalena, et al. "Oscillatory polarons generation by near IR and spin induced chirality studies in optically nonlinear 1, 3-dinitrobenzene crystal." Optical Materials 35.5 (2013): 1004-1012.*

Ramakrishna Matte, H. S. S., et al. "MoS2 and WS2 analogues of graphene." Angewandte Chemie International Edition 49.24 (2010): 4059-4062.*

Xu, Chenggen, et al. "Synthesis of graphene from asphaltene molecules adsorbed on vermiculite layers." Carbon 62 (2013): 213-221.*

Li, Guoxing, et al. "Architecture of graphdiyne nanoscale films." Chemical Communications 46.19 (2010): 3256-3258.*

Kidena, Koh, Yuma Kamiyama, and Masakatsu Nomura. "A possibility of the production of carbon nanotubes from heavy hydrocarbons." Fuel processing technology 89.4 (2008): 449-454.*

Deng, X. Q., et al. "Spin filter effects in zigzag-edge graphene nanoribbons with symmetric and asymmetric edge hydrogenations." Carbon 66 (2014): 646-653.*

Trzebiatowska-Gusowska, M., et al. "The revision of intermolecular interactions in 1, 3-dinitrobenzene crystal—the role of nitro groups in optical nonlinearity." Journal of Raman Spectroscopy 41.10 (2010): 1338-1347.*

Arora, S. K., and M. Sundaralingam. "The crystal and molecular structure of 4-methyl sulfonic acid (p-toluenesulfonic acid) monohydrate, C7H8S03−. H3O+, an oxonium salt." Acta Crystallographica Section B: Structural Crystallography and Crystal Chemistry 27.7 (1971): 1293-1298.*

Nie, J-J., et al. "2, 6-Dinitrotoluene." Acta Crystallographica Section E: Structure Reports Online 57.9 (2001): o827-o828.*

Piermarini, G. J., et al. "1,4-Dinitrocubane and Cubane under High Pressure." Propellants, explosives, pyrotechnics 16.4 (1991): 188-193.*

Day, Graeme Matthew. Lattice dynamical studies of molecular crystals with application to polymorphism and structure prediction. University of London, University College London (United Kingdom), 2003.*

* cited by examiner

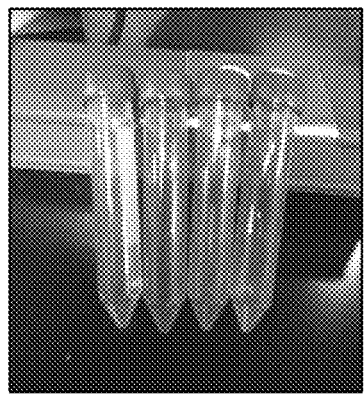 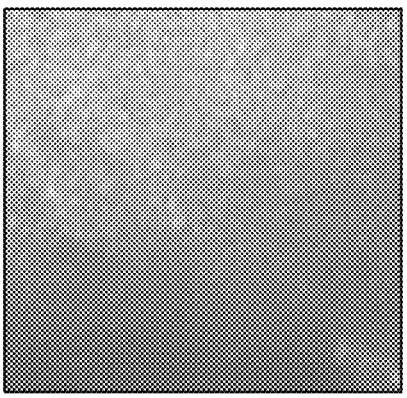 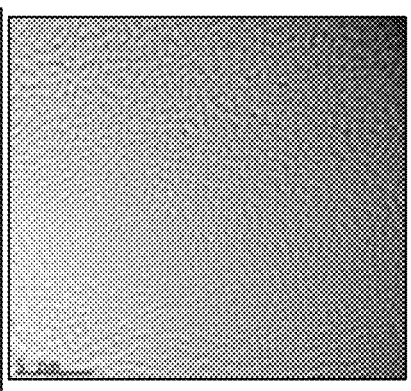
FIG. 1A    FIG. 1B    FIG. 1C
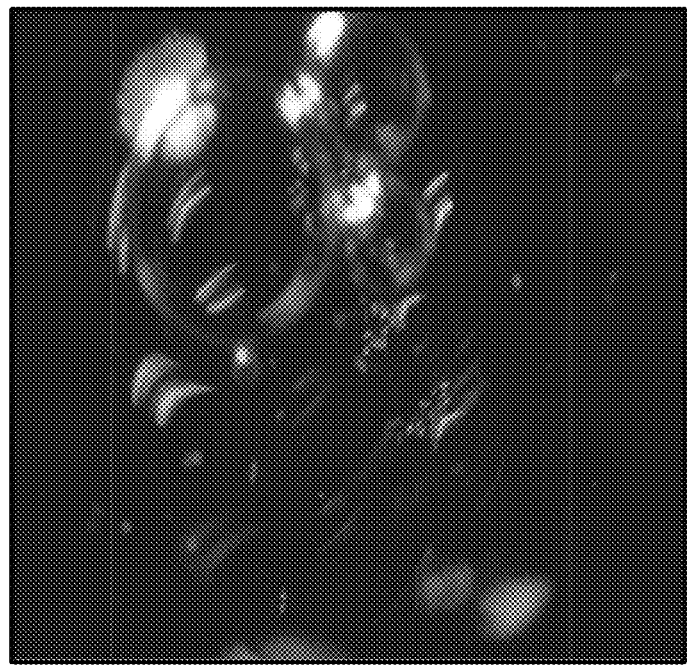
FIG. 2

METHODS FOR SYNTHESIS OF GRAPHENE DERIVATIVES AND FUNCTIONAL MATERIALS FROM ASPHALTENES

CROSS-REFERENCE TO RELATED APPLICATIONS

This application claims the benefit of the filing date of and priority to: U.S. Provisional Application Ser. No. 62/035,140 entitled "Methods for Synthesis of Graphene Derivatives and Functional Materials from Asphaltenes" and filed Aug. 8, 2014, Confirmation No. 9603; said provisional application is incorporated by reference herein in its entirety for all purposes.

STATEMENT REGARDING FEDERALLY SPONSORED RESEARCH OR DEVELOPMENT

Not Applicable.

BACKGROUND OF THE INVENTION

Asphaltene is a component of crude oil that is widely known for causing problems and difficulties in the oil industry. Asphaltenes can precipitate organic materials and form emulsions, which is problematic when transporting crude oil by pipeline. As a result of its adsorption capability, asphaltene has the propensity to form colloidal aggregations in solution thereby promoting stable water in oil emulsions. These characteristics of asphaltenes results in large maintenance costs and can bring oil production to a halt. The majority of these problems are attributed to the presence of heteroatoms and metals in crude oil. Due to the economic burdens of asphaltenes the oil industry considers asphaltenes waste.

The classification of asphaltene as a waste component of crude oil may generate different opinions from different industries. Reported studies have raised the possibility of transforming asphaltene from its present classification as a waste into a more attractive material for use in the semiconductor industry. Masson et al. concluded solid asphaltene lacks a crystalline phase but has an ordered amorphous phase or mesophase (Masson et al., 2002, *Energy Fuels*, 16(2), 470-476). In contrast, Bagheri et al. reported the first observation of liquid crystals in asphaltenes. Liquid-crystal domains were reported to appear in asphaltene solids at ~330 K in a nitrogen atmosphere and disappeared at ~430 K (Bagheri et al., 2010; *Energy & Fuels*, 24(8), 4327-4332). The classification of asphaltenes received yet another dimension when studies reported the observation of a graphene structure and its derivatives in asphaltenes (Perez-Hernandez et al., 2003; *Fuel*, 82(8) 977-982; Camacho-Bragado et al., 2002; *Carbon*, 40(15) 2761-2766; Cheng et al., 2011, *Carbon*, 49 (8) 2852-2861; Sreeprasad et al., 2013, *Journal of Hazardous Materials*, 246-247, 213-220).

One solution to the asphaltene problem is to remove the asphaltene component of a target material such as bitumen or oil. The removal of asphaltenes from bitumen or heavy oils can lead to the reduction of viscosity in addition to the reduction of metal and heteroatom content. Once removed, asphaltenes must then be disposed. Dumping asphaltenes as a waste has a deleterious effect because such practice without the availability of a reliable waste management system will contribute to the continuous generation of $CO_2$, which can pollute the ecosystem and may lead to a major global problem because asphaltenes do not biodegrade quickly (Tavassoli et al., 2014, *Fuel*, 93, 142-148).

While they are presently utilized for practical uses such as road construction material, water-proofing and roofing material, and as curing agents/corrosion inhibitors, the potential of asphaltenes has not been fully explored and the isolation/production of asphaltene outpaces its utilization. In order to justify asphaltene separation it is imperative to discover new ways of utilizing asphaltenes in a more value-added or unique way.

There is a need for additional methods for handling asphaltenes and methods for modifying them to produce useful compositions.

An object of the invention is to develop methods for the derivatization of asphaltene.

An object of the invention is to discover new applications for asphaltene.

SUMMARY OF THE INVENTION

Certain embodiments are directed to methods of synthesizing products derived from asphaltenes, i.e., producing asphaltene derivatives or asphaltene products. In certain aspects, asphaltenes can be modified or derivatized to produce useful compositions that can be incorporated into various products. Derivatization is a technique used in chemistry that transforms a chemical compound into a product of similar chemical structure, called a derivative. A functional group of the compound (asphaltenes) participates in the derivatization reaction and transforms the compound to a derivate having distinct chemical properties such as reactivity, solubility, boiling point, melting point, aggregate state, or chemical composition. Resulting chemical properties can be used to quantify or separate the product from the source compound. Asphaltenes can be used as source for various asphaltene derivatives or asphaltene products.

Asphaltene can be modified or derivatized by aromatization, functionalization, surface modification, dimerization, electrophilic aromatic substitution, nucleophilic aromatic substitution, desymmetrization, esterification, reduction, oxidation, and combinations thereof.

Generally the method comprises one or more steps selected from (a) isolation or separation of asphaltene from a source material, (b) fractionation or purification of an asphaltene composition, (c) derivatization or functionalization of the asphaltene composition to produce an asphaltene product or asphaltene derivative, and/or (d) isolation or purification of the asphaltene product or asphaltene derivative. The methods described herein can reduce the cost of production and provide affordable methods for the production of multifunctional materials from asphaltenes. In certain aspects the materials described herein can be used in applications such as bioimaging, smart materials, lasing, drug delivery, pharmaceuticals, batteries, photovoltaics, light-emitting diodes, etc.

The methods produce materials that can exhibit plastic behavior (plastotenes), elastic behavior (elastotenes), graphene properties (quantum dots, etc.), and/or liquid crystalline phases (discotic, etc.). In certain aspects asphaltene is a source of graphene and graphene derivatives. Certain aspects are directed to method of synthesizing graphene and graphene derivatives.

In another embodiment the invention adapted chemical processing methods that resulted into the synthesis of asphaltene derivatives and the regeneration of derivatives from subsequent products.

Certain embodiments are directed to methods adapted and modified for the production of benzene derivatives.

In certain aspects of materials that may be selected without limitation from zero dimensional materials (0D), one dimensional materials (1D), two dimensional materials (2D), three dimensional materials (3D) materials, solvents, surfactants, esters, hybrids, and any combination thereof.

Certain embodiments are directed to new class of materials and the utilization of their unusual and interesting properties for various applications.

In certain aspects asphaltene derivatives are classified into disc like structures (spherical molecules) rod like structures (tubular molecules) 0D, 1D, 2D, 3D, and any combination.

Another aspect of the invention describes methods of extracting or isolating individual atomic planes from bulk crystals or layered materials. The invention discloses a method of producing 2D materials from bulk or layered structures Another embodiment of the invention describes methods that involve hydrothermal, solvothermal and chemical methods for the derivatization of asphaltene.

The present invention utilizes oxidation and reduction processing procedures. Asphaltenes can be separated from a source by differential solubility.

Once separated from its source asphaltenes may then be further fractionated by using, for example, differential solubility, differential precipitation, size fractionation, and the like. Certain embodiments are directed to methods for processing asphaltene comprising: (i) dissolving asphaltene in a solvent forming a asphaltene solution, (ii) refluxing the asphaltene solution with additives for a period of time to form a refluxed solution; (iii) modifying the surface of the refluxed solution to produce a modified solution (iv) adjusting the pH or neutralizing components of the refluxed solution by introducing a basic solution into the refluxed solution and incubating for a period of time; (v) quenching the pH adjusted or neutralized refluxed solution by adding an acidic solution; and (vi) isolating or purifying a resulting asphaltene derivative or product. Variation in a number of the parameters, such as solvent, volume, reagent concentrations, temperature, incubation time, etc., can be used to alter the characteristics of the asphaltene derivatives. Certain embodiments are directed to an asphaltene derivative produce by such methods.

Other embodiments of the invention are discussed throughout this application. Any embodiment discussed with respect to one aspect of the invention applies to other aspects of the invention as well and vice versa. Each embodiment described herein is understood to be embodiments of the invention that are applicable to all aspects of the invention. It is contemplated that any embodiment discussed herein can be implemented with respect to any method or composition of the invention, and vice versa. Furthermore, compositions and kits of the invention can be used to achieve methods of the invention.

An embodiment of the invention categorizes the derivatives into different classes in terms of morphologies and properties. In certain aspect the dimensions of the materials are used for the classification.

Also disclosed is a method for processing asphaltene comprising: refluxing an asphaltene solution or dispersion for a period of time to form a refluxed solution; modifying the refluxed solution by introducing a basic solution into the refluxed solution and incubating for a period of time forming a neutralized solution; quenching the neutralized solution by adding an acid solution forming a quenched solution; and isolating a resulting asphaltene derivative. The asphaltene solution may comprise an aromatic solvent or an oxidizing acid. The basic solution may be an NaOH solution; the quenching solution may be an HCl solution. In one embodiment, the asphaltene solution is refluxed at a temperature of 60° C. to 90° C., e.g., for about 48 to 72 hours. The neutralized solution may be incubated at a temperature of 80° C. to 100° C., e.g., for about 24 to 72 hours. The quenched solution may be incubated at a temperature of 80° C. to 100° C. for about 24 to 72 hours. The asphaltene derivative may be isolated by filtration or crystallization. The method may further comprise exposing the solutions to microwave irradiation for 10 to 60 seconds. In one embodiment, there is described an asphaltene derivative produced by this method.

In another embodiment, there is disclosed a method for producing graphene derivatives comprising: refluxing an asphaltene solution or dispersion for a period of time to form a refluxed solution; neutralizing the refluxed solution by introducing a basic solution into the refluxed solution and incubating for a period of time forming a neutralized solution; quenching the neutralized solution by adding an acid solution forming a quenched solution; and isolating a resulting asphaltene derivative.

In yet another embodiment, there is disclosed a method for producing a liquid crystal from PAH compounds comprising: refluxing a porphyrn solution or dispersion for a period of time to form a refluxed solution; neutralizing the refluxed solution by introducing a basic solution into the refluxed solution and incubating for a period of time forming a neutralized solution; quenching the neutralized solution by adding an acid solution forming a quenched solution; and isolating a resulting porphyrn derivative.

Also disclosed is a method for synthesis of graphene derivatives and functional materials comprising: forming a refluxed solution comprising starting material and one or more additives at a selected temperature for a period of time. This method is a recycling method that can further comprise derivatising asphaltene. In one embodiment, the starting material comprises any of: layered materials, stacked materials, asphaltenes, two dimensional materials, molybdenum sulfide, boron nitride, carbon slurry, graphitic compounds, soot, lignite, peat, layered materials, PAH compounds, resin, graphite, petrified oil, asphalt, bitumen, modified bitumen, coal, modified coal, modified asphaltenes, anthracite, modified anthracite and combinations thereof. The graphene derivatives may comprise single crystalline graphene, 2D carbon allotropes of graphene, 1D carbon allotropes of graphene, 0D carbon allotropes of graphene, 3D carbon allotropes of graphene, fullerene derivatives, carbon nanotube derivatives, carbon nanobud, carbon nanobud derivatives, graphene nanoribbon and combinations thereof. The functional materials comprise quantum dots, nanomaterials, 2D materials, liquid crystals, benzene derivatives, sulfonic derivatives, elastomers, plastomers, lastomers, hybrid, composites, esters, metamaterials, complex oxides and combinations thereof. The refluxed solution may comprise carbon powder or continuous phase. The one or more additives may comprise an oxidant, a solvent, a surfactant or a dispersant. In one embodiment, the selected temperature ranges from about 25° C. to about 120° C. The oxidant may be selected from any of: mixed acids, hydrogen peroxide, methanol, ammonia, hydrochloric acid, taurine, nitric acids, sulfuric acids, water, alkyl toluene sulfonic acid and any combination thereof. The solvent may comprises any of: ammonia, methanol, aromatic solvents, water, tetrahydrofuran, diethyl ether, carbon tetrachloride, hydrogen peroxide, sulfate, alkyl phenol, toluene, benzene, xylene and any combination thereof. The surfactant may comprise alkyl sulfonic acid oxonium salt. In one embodiment, the dispersant comprises p-alkylphenols, p-alkylbenzenesulfonic acid, or alkyl sulfonic acid. The method may further comprise a step of separating the refluxed solution to produce carbon powder and continuous phase. The separation may comprise filtration, centrifugation, dialysis, solvent extraction, recrystallization, adding solvent and any combination thereof. The method may further comprise adding modifying agent to the refluxed solution to form a modified solution. The modifying agent may comprise any of sodium hydroxide, sodium borohydride, methanol, dioxane, hydrochloric acid, sodium tetrahydrofuran, carbon tetrachloride, copper chloride, phosphoric acid, water, methanol, hydrochloric acid, sodium nitrite, sodium sulfide, copper bromide and a combination thereof. The method can further comprise separating modified solution into carbon powder and continuous phase using any of filtration, centrifugation, dialysis, washing, recrystallization, solvent extraction, addition of solvent, and a combination thereof.

The method can further comprise adding controlling agent to the modified solution to form a controlled solution and further comprise separating the controlled solution into carbon powder and continuous phase using centrifugation, dialysis, washing, recrystallization, solvent extraction, addition of solvent. A modifying agent, such as a continuous phase, may be added to continuous phase to form an assembled solution. The method may also include the steps of recrystallization of the continuous phase or assembled solution to form crystals, benzene derivatives and/or sulfonic derivatives. The recrystallization step may comprise centrifugation, filtration, addition of solvent, incubation.

The graphene derivatives may comprise quantum dot composition of nanobud, metals and plurality of functional group.

Also disclosed is a nanobubble material comprising nanobud, metals and plurality of functional group; a nanocomposite material comprising nanobud, metals and plurality of functional groups; a Fullerene composite with a plurality of functional groups; a nanotube composite with a plurality of functional groups; a 2D single liquid crystalline carbon allotropes graphene; a 2D carbon allotropes of graphene with a plurality of functional groups where the plurality of functional groups may be are selected from group containing amide group, carbonyl group, oxygen group, ester, carboxyl group, alkyl group, and acyl group; a 2D single crystalline carbon allotropes of graphene with asymmetric unit formula $C_7H_6N_2O_4$; 2D single crystalline carbon allotropes of graphene with asymmetric unit formula $C_6H_4N_2O_4$; a 2D single crystalline carbon allotropes of graphene with asymmetric unit formula $C_7H_7O_3S-H_3O+$; a 2D single crystalline carbon allotropes of graphene with asymmetric unit formula $C_7H_7O_3SH+$; and a 2D single crystal with asymmetric unit formula $(Na_6O_{16}S_4)n$.

The methods disclosed herein can be used to synthesize graphene derivatives for use as nanofillers, transistors, sensors, actuators, pharmaceutical, semiconductor, metal hybrids, anisotropic conductor, desalinator, cancer detection, thermoelectric, field effect transistor, organic ferroelectrics, molecular packing, bioimaging, energy storage, electronics, hydrogen storage, biosensing, spintronics, smart materials, lasing, drug delivery, batteries, and light-emitting diodes.

As disclosed is a method for producing elastomers from polymers and synthetic compounds comprising: refluxing a resin solution or dispersion for a period of time to form a refluxed solution; neutralizing the refluxed solution by introducing a basic solution into the refluxed solution and incubating for a period of time forming a neutralized solution; quenching the neutralized solution by adding an acid solution forming a quenched solution; and isolating a resulting resin derivative.

The use of the word "a" or "an" when used in conjunction with the term "comprising" in the claims and/or the specification may mean "one," but it is also consistent with the meaning of "one or more," "at least one," and "one or more than one."

Throughout this application, the term "about" is used to indicate that a value includes the standard deviation of error for the device or method being employed to determine the value.

The use of the term "or" in the claims is used to mean "and/or" unless explicitly indicated to refer to alternatives only or the alternatives are mutually exclusive, although the disclosure supports a definition that refers to only alternatives and "and/or."

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

Other objects, features and advantages of the present invention will become apparent from the following detailed description. It should be understood, however, that the detailed description and the specific examples, while indicating specific embodiments of the invention, are given by way of illustration only, since various changes and modifications within the spirit and scope of the invention will become apparent to those skilled in the art from this detailed description.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of the specification embodiments presented herein.

FIG. 1 shows (a) a photograph of a synthesized quantum dots material (b) polarizing microscopy image of quantum dots material viewed under the polarizer, and (c) TEM image of synthesized quantum dots material showing ordered planes at the center and amorphous edges.

FIG. 2 confocal microscopy image of the synthesized graphene quantum dots showing the presence of two phases i.e. a colored rod like (tubular molecules) and a tiny disk like (caged molecules) in its structure.

Figure 3:
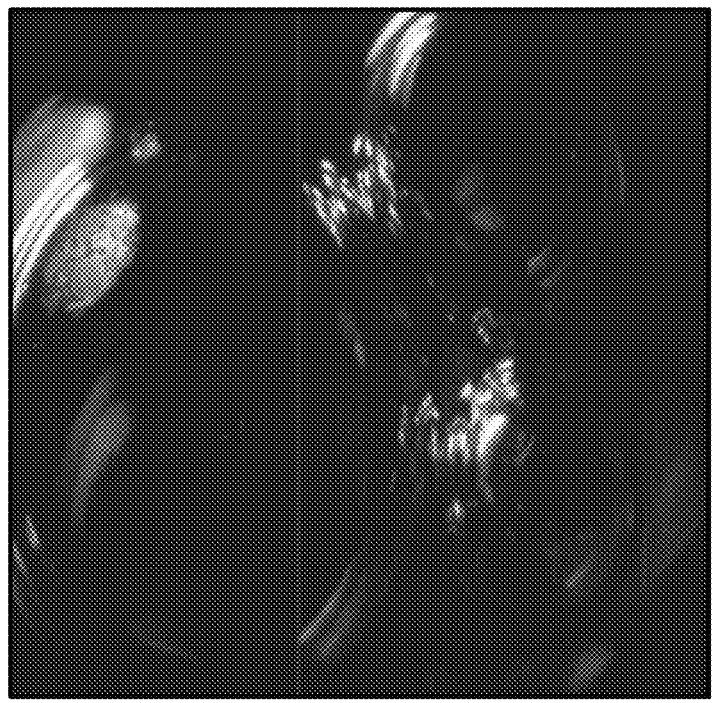
FIG. 3 High resolution confocal microscopy image of t rod like molecule/tubular molecules.
Figure 4:
FIG. 4 High resolution confocal microscopy image of the discotic molecule/caged molecules (0D).
Figure 5:
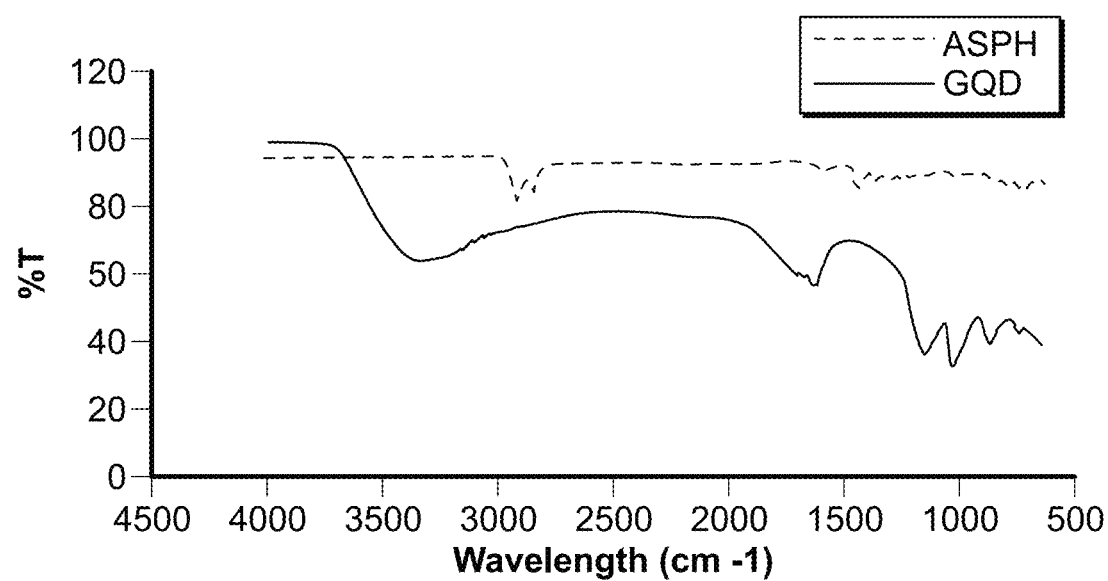
FIG. 5 shows IR spectra of starting material (ASPHALTENE) and synthesized quantum dots material (GQD).

TABLE 1 shows the quenching time for different samples of lastotenes.

DETAILED DESCRIPTION OF THE INVENTION

Asphaltenes represent a chemically complex and structurally heterogeneous group of organic molecules that are present in crude oil. Asphaltenes are typically characterized as macromolecules with rigid core aromatic rings and flexible alkyl chains with a variable amount of heteroatoms and metals (Andersen and Speight, 1999, *Jour. Pet. Sci. Eng.,* 22, 53-60). Asphaltenes typically contain oxygen (0.3-4.8%), sulfur (0.3-10.3%), nitrogen (0.6-3.3%), and small amounts of metals, such as Fe, Ni, and V (Buch et al., 2003, *Fuel*, vol. 82 (9), 1075-1084; Groenzin and Mullins, 2000, *Fuels,* 14 (3), 677-684). These compounds are involved in the precipitation of organic deposits in petroleum reservoirs, the formation and stabilization of emulsions, and the wettability of transport pipelines during transportation. Wetting is the ability of a liquid to maintain contact with a solid surface, resulting from intermolecular interactions when the two are brought together. The degree of wetting or wettability is determined by a balance between adhesive and cohesive forces. Wetting is important in the bonding or adherence of two materials. As a result of its adsorption capability, asphaltene has the propensity to form colloidal aggregations in solution thereby promoting stable water in oil emulsions. These characteristics of asphaltene are problematic in oil production and result in large maintenance costs.

Various groups have reported on the characterization of asphaltene structure yet consensus remains elusive. Two primary model structures have been proposed. One includes the island model which depicts one poly-aromatic hydrocarbon (PAH) architecture and the second describes it as a multiple cross-linked PAHs architecture (the archipelago architecture) (Strausz et al., 1992, *Fuel,* 71, 1355-1363; Groenzin and Mullins, 2000, *Fuels,* 14 (3), 677-684; Gray, 2003, *Energy and Fuels*, 17 (6), 1566-1569). Despite this controversy over structure, the current description provides methods for producing a variety of products using asphaltenes as a source material.

I. ASPHALTENES AND METHODS OF MAKING ASPHALTENE PRODUCTS

As described herein, asphaltenes may be used as a source material for producing materials such as graphene and elastomeric liquid crystal materials, which include graphene quantum dots, nanoribbons and the like, for use in the biotechnology and pharmaceutical industry, as a sensor material, as super capacitors and super conductors, for water purification, for use in lithium batteries and fuel cell batteries, for use in electronic industry (smart phones (Cincotto et. at., 2014, *Chem. Eur. J.*, 20, 4746-4753) and other electronic technologies (RFID, smart packaging, super capacitors, composites, ITO replacement, sensors, logic and memory printable and flexible electronics)).

Asphaltene is a high molecular weight polar aromatic compound that contains metals and/or heteroatoms. It is known that variation exists in asphaltenes, this variation depends on geographic location, the source of asphaltenes (e.g., petroleum, coal etc.) and the mass or volume ratio of source of asphaltenes and precipitants, and the type of precipitants used for extraction (chain length of alkanes, polarity, physical properties etc.). Asphaltenes can be described/characterized in terms of solubility, structure, and source.

Asphaltene Solubility. Asphaltene, defined broadly, is the highest molecular weight and most polar aromatic component of crude oil. Asphaltenes are the fraction of crude oil that is insoluble in a low-boiling paraffinic solvent (n-pentane or n-heptane) but soluble in aromatic solvents such as toluene or benzene. Paraffinic solvents or alkane solvents are saturated hydrocarbons having the general chemical formula $C_nH_{2n+2}$. Low boiling point paraffinic solvents can be selected from the group including saturated acyclic or cyclic C2, C3, C4, C5, C6, C7, C8, or C9 alkanes. Precipitants for asphaltenes are known and include n-alkanes, carbon sulfide, carbon dioxide, ethyl acetate, methylene chloride, etc. (Mullins et al., 2007, Asphaltenes, Heavy Oils, and Petroleomics Springer).

Asphaltene Structure. The structure of asphaltene is one of the most contentious issues in the history of crude oil studies. Models of asphaltene structure include the archipelago model, yen model, yen-Mullins model, Altamira structure etc. (Gray, 2003, *Energy and Fuels*, 17, 1566-1569; Mullins, 2010, *Energy Fuels*, 24, 2179-220).

Asphaltene Source. Asphaltene is described as a component of carbonaceous material such as crude oil, bitumen, coal, oil sand etc. (for example see worldwideweb at ualberta.ca/~gray/Links %20&%20Docs/Asphaltenes %20web %20page.pdf). As such asphaltenes can be characterized by their source.

Furthermore, asphaltenes can be classified as unfractionated or fractionated. The term "unfractionated asphaltenes" is used for asphaltenes extracted using methods that result in Saturate, Aromatic, Resin and Asphaltene (SARA) fractionation. SARA is an analysis method that divides crude oil components according to their polarizability and polarity. The saturate fraction consists of nonpolar material including linear, branched, and cyclic saturated hydrocarbons (paraffins). Aromatics, which contain one or more aromatic rings, are slightly more polarizable. The remaining two fractions, resins and asphaltenes (unfractionated), have polar substituents. The distinction between the two is that asphaltenes are insoluble in an excess of heptane (or pentane) whereas resins are miscible with heptane (or pentane). There are three main methods to obtain SARA results. One method is Iatroscan TLC-FID, it combines TLC with flame ionization detection (TLC-FID) and is also referred to as IP-143. Asphaltene is widely known to exhibit surface charge. The type of charge is reported to be dependent on the ratio of volume of source to the extracting solvent.

Fractionated asphaltenes are obtained by further subdividing the unfractionated asphaltenes. Asphaltenes can be separated into fractions based on solubility in various solvents or solvent mixture. A number of solvents can be used to differentially extract asphaltenes from unfractionated asphaltenes or directly from the asphaltene source. Fractionation can be done using solvent mixtures having different proportion of toluene to alkane. Processing parameters such as volume of solvents, mixed solvents, processing temperature and pressure can be varied and can be used to classify asphaltenes (See Mullins et al., 2007, Asphaltenes, Heavy Oils, and Petroleomics, Springer; U.S. Pat. No. 8,389,853; U.S. publication 2013/0220421). Asphaltene is generally regarded as the most polar aromatic component of crude oil. The magnitude of its polarity is however dependent on the solvents. Therefore, there is a possibility of having the arrangement of asphaltenes in the order of polarity (Andersen et al., 1997, *Science and Technology*, 15, 185).

Asphaltenes may be processed to obtain (i) metallized asphaltenes (e.g., by hot mixing of asphaltenes and metals, and drying), (ii) demetallized asphaltenes (e.g., purification with solvents or reaction with strong acids and drying under vacuum), and (iii) fractionated asphaltenes (obtaining different fractions by employing two or more solvents that may be employed at different period of time or mixed at a known proportion).

Metallized asphaltene is the asphaltene that is mixed with metals by known processing methods. When metals are removed from asphaltenes the remaining product is called demetallized asphaltene. Demetallized asphaltenes are obtained via the reaction of asphaltenes with acids, preferably strong acids. Methods employed for the insertion and removal of metals from polymers, small and large molecules may also be applicable to asphaltenes (for example see U.S. publication 20130220421, which is incorporated herein by reference).

Also, asphaltenes can be described as a mixed asphaltene. Mixed asphaltene describes a mixture of asphaltene with other materials. It includes the treatment of asphaltenes with materials that include polymers, small molecules, large molecules, ceramics, composites, halogens, non-metals, semiconductors, and mixtures thereof.

Asphaltenes may be modified to obtain variation in the structure. Modification may include thermal, chemical and mechanical modifications.

A. Isolation/Separation of Asphaltenes

There are a number of methods for characterizing crude oil components, as well as isolating and identifying asphaltenes. In certain methods the isolation of asphaltenes is initiated by precipitation of asphaltenes followed by the purification of the asphaltene precipitate. In a further aspect the asphaltenes can be solubilized prior to or after precipitation.

One example of isolating asphaltene from crude oil comprises dissolving crude oil in heptane. Stirring the heptane/crude oil mixture for about 48 hours at room temperature. Filtering the mixture through filter paper and rinsing the filtrate using toluene. The filtered solution is dried and a crude asphaltene composition collected from the filter.

The crude asphaltene preparation can then be further purified. Crude asphaltene is dissolved in toluene and stirred for about 5 hours. The stirred solution is filtered, using for example filter paper no. 40. Purified asphaltene passes through the filter paper while impurities remain on the filter. The filtered asphaltene solution is dried at room temperature. The result is purified asphaltene that is typically a black shiny product. This product can then be further derivatized using the methods described herein.

Depending on the particular asphaltene starting material, it should be appreciated that the structure of asphaltene extracted from contemplated methods may vary considerably.

B. Methods for Making Asphaltene Derivatives

Certain embodiments are directed to methods and compositions for the production or synthesis of materials from asphaltenes (making asphaltene derivatives). Modification or functionalization methods facilitate the synthesis of asphaltene derivatives that vary in morphology, size, shape, bonding, absorption, transmission, fluorescence, color, supramolecular structure, lattice structure, diffraction pattern, functional groups, etc. Certain embodiments are directed to methods adapted and modified to transform asphaltenes into materials that may be selected from single crystals, graphene, plastomers, plastic, elastomers, liquid crystal derivatives and combinations thereof.

Asphaltenes can be functionalized and the properties of asphaltene derivatives manipulated by altering the conditions, reagents, and parameters of the methods described herein. In one embodiment this method may be regarded as a functionalization, oxidation, and reduction process. In certain aspect the reaction involves one or more procedures that involves physisorption and chemisorption at an asphaltene-solvent interface, which facilitates conjugation of a fragment of asphaltenes with an active component of the solvent. The reaction may result in the functional groups being absorbed either on the surface of the asphaltene aggregation or become bonded with the polar group of asphaltene molecules to form functionalized asphaltene. Modification of the surface may result in the elimination or substitution of the functional group with a substituent group.

The presence of electronegative heteroatoms like nitrogen or oxygen in the structure of asphaltene results in an asphaltene being a strong hydrogen bond acceptor and weak hydrogen bond donor, which allows for the use of a dispersant when working with asphaltenes. Strong acids become effective asphaltene dispersants if their alkyl tails are long enough to provide the necessary steric-stabilization layers around the asphaltenes. Besides, organic salts may be strong donors of the hydrogen bonding and may also instill stability on asphaltenes structure. It is apparent that the pH of a solution is a determining factor. In another embodiment long alkyl chain compounds are employed for the dispersion of asphaltene.

In certain aspects asphaltenes are reacted with an oxidizing acid. An oxidizing acid is a Brønsted acid that is also a strong oxidizing agent. All Brønsted acids can act as oxidizing agents, because the acidic proton can be reduced to hydrogen gas. Some acids contain other structures that act as stronger oxidizing agents than hydrogen ion. Generally, they contain oxygen in the anionic structure. These include, but are not limited to nitric acid, perchloric acid, chloric acid, chromic acid, and sulfuric acids.

Methods employed in the present invention can be classified into three groups, dispersant method, dispersant/solvent method, and recycle method.

In certain aspects nitric acid, sulfuric acid, sodium hydroxide, and hydrochloric acid can be used in the methods described. However, other reagents with similar properties can also be used in place of these particular reagents.

Another embodiment is directed to the use of a additive that is selected from surfactants, intercalating agents, coupling agents, catalysts, acids, oxidizing agents, reducing agents, solvents, sulfonic acid derivatives, composites, hydrocarbons, dispersing agents and any combination thereof.

Another embodiment of the invention involves the derivatization of asphaltene by aromatization, functionalization, surface modification, dimerization, electrophilic aromatic substitution, nucleophilic aromatic substitution, desymmetrization, hydrogenation, nitration, sulfonation halogenation recrystallization, esterification, reduction, oxidation, and combinations thereof.

In one embodiment the invention relates to a facile and cheaper method for producing graphene derivatives. In certain aspects the invention discloses methods of producing functional materials and graphene derivatives.

An embodiment of the invention discloses a range of products that include graphene derivatives and functional materials that exhibit different properties and morphologies. The range of properties of the products include optical, thermal, electrical, magnetic, chemical, mechanical, biological, astrological, physical, etc.

The morphologies of the products in terms of size i.e. quantum, nano, micro, bulk; shape i.e. rod like (sphere), disc like (tubular), dimensions i.e. OD (caged molecules), 1D (nanotubes), 2D (flat molecules), 3D (bulk) and any combination (nanobud) thereof.

The invention discloses a new class of materials that exhibit unique properties and unusual behaviors. In certain aspects a material comprising any three or more combination of graphene, carbon nanotube, metals, heteroatoms, fullerene is disclosed.

The properties are exhibited by a combination of materials that include graphene, derivatives, 2D materials, surface active materials, liquid crystalline materials, surfactants, single crystals, elastomers, plastomers, lastomers and any combination thereof.

Certain aspects of the invention describes another embodiment of the invention describes methods that involve hydrothermal, solvothermal, chemical and mechanical methods for the derivatization of asphaltene.

An embodiment relates to the use of layered or stacked compound as starting material.

In an embodiment the invention methods of derivatization of aromatic compounds are adapted. Organic chemistry taught methods for derivatization of aromatic compounds. In certain aspect the invention adapted methods substitution methods for the derivatization of aromatic compounds like nitrobenzene, amines, amino acids, alcohols.

An embodiment of the invention adapted substitution reactions comprising without limitation nitration, sulfonation, sulfation, Friedel crafts alkylation, Friedel craft acylation, Sandmeyer reaction, halogenation, hydrogenation and any combination. In certain aspect present invention envisioned that the replacement of hydrogen with functional group may result in the formation of a large number of derivatives.

In one embodiment the present invention coined names like lastotene, elastotene, plastotene, nimota, azix for the classification of the products.

Another embodiment of the invention relates to the use of dispersant, asphaltene studies taught the use of surfactants or ionic liquids (Journal of Petroleum Engineering Volume 2013 (2013)) aromatic (J Colloid Interface Sci. 2015 Feb. 15; 440:23-31) and sulfonic derivatives (U.S. Pat. No. 7,579,303 B2) as asphaltene dispersant.

In one embodiment the invention describes method of modifying the any or a combination of edges, sides and terminal ends of asphaltene derivatives with electron donating functional groups like $NR_2$, $NH_2$, OH, OR, alkyl, NHOR, and halides and electron withdrawing group like COR, $SO_2$, OH, $NO_2$, CN and $NR_3$.

An embodiment of the invention discloses the economic potential of the process in terms of materials continuous flow reactions that enables the recycling of the by-products.

In another embodiment the dispersion method involves a range of processing techniques not limited to mixing, nitration, oxidation, reduction, halogenation, coupling, sulfonation, diazonization, hydrogenation and any combination thereof.

The starting material may include crude asphaltene or treated asphaltenes e.g., thermally treated asphaltenes, milled asphaltene, mechanically treated, thermo-mechanically treated asphaltene as starting material.

The term "additive" include of heteroatom containing surfactants, acids, mixed acids, solvents, organic solvents, antifoulants, coagulants, flocculants, solubilizing agents, antifoaming agent, emulsifying agents, dispersing agents, ionic liquids, salts, oxidizing agents, reducing agents, catalysts, amphiphilic solvents, dispersants, oxidants, acids, polymer copolymer, biological macromolecules, acidic solution, DNA, protein molecules, organic solvents, polar solvents, non-polar solvents, aromatic solvents, water, alcohol, alkane, acidic ionic liquids and combinations thereof.

In certain aspects the intercalating agents or additives may be selected from any of but not limited to nitric acid, sulfuric acid, aromatic solvent, polar solvent, methanol, water, peroxide, formic acid, benzene, toluene, naphthalene, nitrobenzene sulfonic acid, linear alkyl sulfonic, polytetrafluoroethylene, sodium nitro sulfonic acid, sodium dodecyl sulfate, cetyltrimethylammoniumbromide, phospholipid, lignin, sulfuric acids, ammonia, taurine, tetrahydrofuran, sulfur trioxide, carboxylic acid, acetic acid, carboxylic acids, sulfonic acids and derivatives, carbonic acids, nitro-sulfonic acids, oleic acid, methyl cellulose, diethylene glycol, polyoxyethylrne sorbitan monolaurate, hydrogen peroxide, oxalic acid, perchloric acid, iron bromide, iron chloride, phosphoric acid, hydrofluoric acid, chlorosulfonic acid, trifluoromethanesulfonic acid, nickel, iron, vanadium, permanganate, oleum, chloride, chlorite, nitrite, potassium permanganate, methanol, acetone, water, propanol, isopropanol, dimethyl sulfoxide, polyethylene glycol (PEG), polymer copolymer (PEtOz-Pcl), alkyl phenol, water, Dodecyl benzenesulphonic acid, methanol, tetrachloromethane, taurine, methionine, trichloromethane, tetrahydrofuran, N-(3-dimethylaminopropyl), N'ethyl-carbodiimide hydrochloride, N'hydroxyl succinimide, poly-lysines (PLs), sodium dodecyl benzenesulfonate, platinum, sodium oleate, cysteine, homocysteine, or mixtures thereof.

A modifying agent or modifier refers to a solvent that contributes to the tuning of the surface or interphase of the refluxed asphaltene solution. A modifier is introduced to alter the edges of the asphaltene emulsion. Such action may result in the change in the structural dimension. In certain aspect a modifier performs several operations that include without limitation addition of functional group(s), elimination of the functional group(s), and substitution of functional group(s).

The modifier may comprise without limitation metal catalyst, basic solution, a reducing agent, a salt solution, metal oxides, sulfides, hydrides and any combination thereof. In certain aspects a modifier is selected from any of sodium chloride, sodium hydroxide, ammonium hydroxide, hydrochloric acid, tetrahydrofuran, amino triazole, dimethylformamide, dimethylsulfoxide, phosphines, phosphites, sulfites, sulfides, hydro sulfites, borohydrides, boranes, hydroxylamine, lithium alhydride, sodium nitrite, hydrochloric acid, copper bromide, copper cyanide, potassium iodide, borohydrides, hydrochloric acid, cyanoborohydrides, aluminum hydrides, hydroquininone, hydrogen dimethylhydrazine, N,N-dimethylhydroxylamine, methylamine, dioxane, amino acids, dimethylamine, trimethylamine taurine, methionine, potassium hydroxide, tin, methanol, alkali sulfide, distilled water, or mixtures thereof.

A controlling agent is added to the solution when there is a need to neutralize the reaction in order to obtain a stable composition. The controlling agent may also modify the pH of the solution. The selection of a controlling agent is dependent on the pH of the solution; the controlling agent is selected from any of hydrochloric acid, sodium bicarbonate, methanol, dimethyl sulfoxide, sodium hydroxide, potassium hydroxide, tetrahydrofuran, dimethylformamide, alkali sulfide, dimethylsulfoxide, phosphines, phosphites, sulfites, sulfides, dioxane, hydrosulfites, borohydrides, boranes, distilled water, sodium bicarbonate or mixtures thereof.

In certain aspects surfactants, sulfonic derivatives, mixed acids, nitric acid, sulfuric acid, sodium hydroxide, and hydrochloric acid can be used in the methods described. However, other reagents with similar characteristics can also be used in place of these particular reagents.

An embodiment of the invention relates to methods comprising an additive reactor or mixer, a modification reactor, control reactor, separation and recrystallization channel. Methods employed in the present invention can be classified into three groups, dispersant method, dispersant/solvent method, and recycle method.

1. Dispersant Method

The dispersant method comprises one or more of the following steps: (i) mixing or refluxing asphaltene with additives (dispersed asphaltene) under considerable stirring at room or elevated temperature for a sufficient period of time. Refluxing with the additives surfactant generates defects at the surface, (ii) in order to obtain a high surface area a surface modifying agent is introduced into the refluxed solution, such as a basic solution and (iii) if necessary the reaction can be quenched with a separating agent that controls pH of the solution and facilitates the separation of polar compounds. The quenched solution can be subjected to purification by filtration, centrifugation, etc.

The dispersant method is an additive method that facilitates the formation of hybrid materials. Additives facilitate the oxidation and functionalization of asphaltene molecules. This may promote molecular assembly and the dispersion of asphaltene. In certain aspect the additive enables substitution reactions e.g., nitration, sulfonation, alkylation. In certain aspect modification of the solution involving one or more stages may be required. In this method, modification of the asphaltene-additive mixture promotes the conjugation of the phases present in the structure of asphaltene. The addition of a modifier and controller. A modifier is added to promote the reduction or protonation of the structure. This may create a stable layer or to improve the stability of the surface by promoting the elimination, replacement and the introduction of additional functional groups. Controlling agent or controller may be needed to improve stability and the control of pH value for the product. Allowing the reaction for longer times improves oxidation resistance and also enhances the surface area for efficient adsorption of the functional group. The resulting product is purified and dried. An example of the product of this method is a quantum dot material that exhibits both tubular and cage molecules in its structure.

Figure 31:
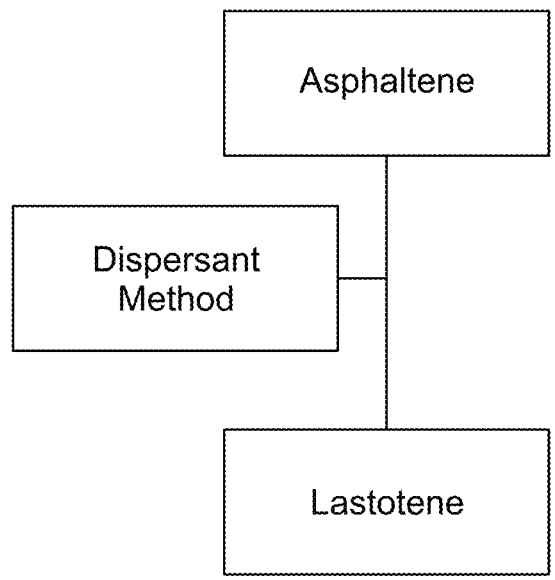
FIG. 31 shows a flow chart for the dispersant method.

In another embodiment, the dispersant method comprises one or more of the following steps: (i) refluxing asphaltene in a surfactant (dispersed asphaltene) under a given temperature for a given period of time, refluxing with the surfactant generates defects at the surface, (ii) in order to obtain a high surface area a surface modifying agent is introduced into the refluxed solution, such as a basic solution and (iii) if necessary the reaction can be quenched with a separating agent that controls pH of the solution and facilitates the separation of polar compounds. The quenched solution can be subjected to purification by filtration, centrifugation, etc. The product of the synthesis may exist in the form of a gel and is referred to as a lastotene. The plot of the dispersant method procedure is shown in FIG. 31.

This method may be regarded as a functionalization, oxidation, and reduction process. The method is a strategy of producing an acidic ionic liquid with a hydrogen bond and electrostatic interaction for the dispersion of asphaltene. The dispersant method is a hydrothermal procedure for introducing oxygen-containing groups, other functional groups, or amphiphiles on the surface of an organic compound thereby establishing a stable layer around its molecules.

A surfactant is required for the surface modification of asphaltene. Allowing the asphaltene-surfactant reaction for longer times improves oxidation resistance and also enhances the surface area for efficient adsorption of the functional group. The term surfactant refers to intercalating agents, amphiphilic solvents, dispersants, oxidants, acids, polymer copolymer, biological macromolecules, mixed acids, acidic solution, DNA, protein molecules, organic solvents, polar solvents, non-polar solvents, aromatic solvents, acidic ionic liquids and combinations thereof.

In one embodiment the invention relates to an additive reaction between the derivatives of asphaltene.

Asphaltene can be dissolved in a solvent. In certain aspects the solvent is an aromatic solvent, such as toluene, benzene, benzene/methanol, chloroform/toluene, xylene and the like.

In certain aspects the intercalating solvent (surfactant) is an oxidative acid or a mixture of oxidative acids. An oxidative acid can be sulfuric acid, perchloric acid, nitric acid, or mixtures thereof. An acid component can be present at final concentration of 0.0001, 0.0005, 0.001, 0.005, 0.01, 0.05, 0.1, 0.2, 0.3, 0.4, 0.5, 0.6 M to 0.5, 0.6, 0.7, 0.8, 0.9, 1 M during reflux. An asphaltene/solvent/oxidative acid mixture can be refluxed at a temperature of 25, 30, 35, 40, 45, 50, 55, 60, 65, 70, 75, 80, 85, 90, 95, 100° C. or greater, including all values and ranges there between. The pH of the solution, which during reflux is less than 2 can be controlled by neutralizing the mixture with a base, such as diluted NaOH, KOH, or the like (0.0001 M to 1M). Quenching can be accomplished by addition of an acidic solution (e.g., HCl) (0.0001 M to 1M). Varying the parameters results in variation of the attribute of the resulting product (e.g., structural morphology, lattice parameter, degree of orderliness etc.). Therefore all variables (e.g., solvents, temperature range, concentration, volume, ratio, time etc.) can be varied to some degree to alter the characteristics of the products.

Figure 7:
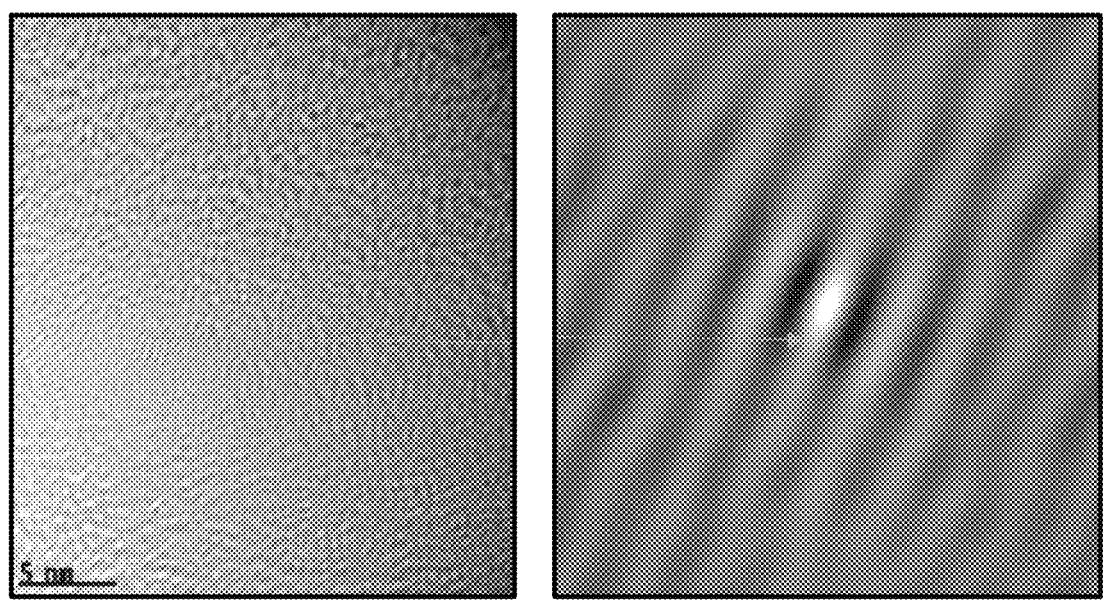
FIG. 7 shows a transmission electron microscope (TEM) image of anisotropic quantum dots material (left) and high resolution transmission electron microscope (HRTEM) image (right) of a cross section of the quantum dots, the result demonstrates that the synthesized quantum dots material exhibits a carbon sheet of a size range 0.1-0.5 nm and defect edges.
Figure 8:
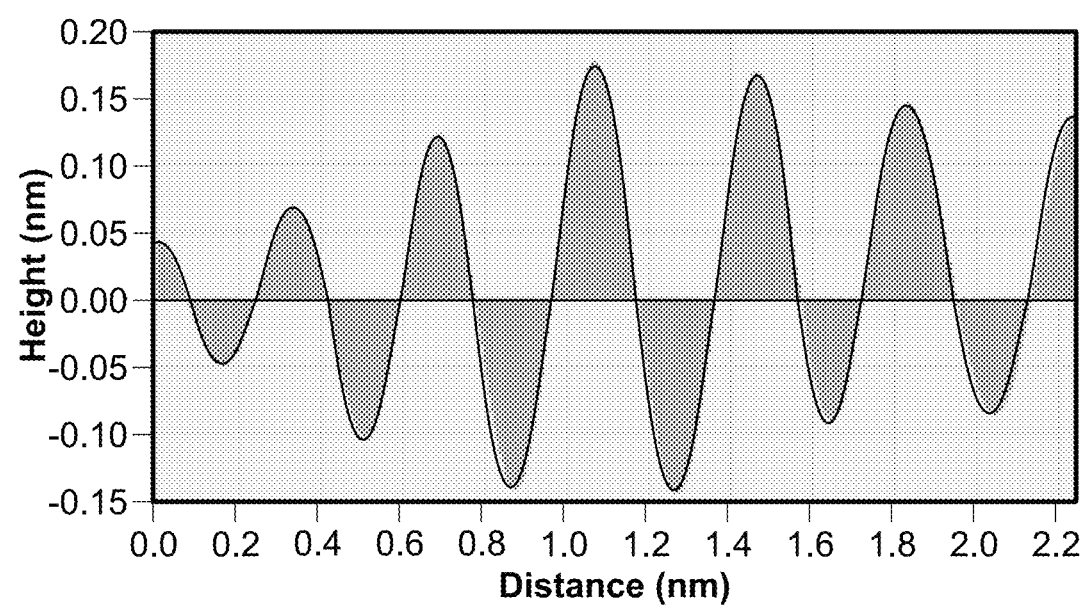
FIG. 8 provides an illustration of the transmitted electron intensity profile of the anisotropic quantum dots material along the periodicity, the average interlayer distance is evaluated as 0.367 nm±1 nm. Analysis of the TEM result indicates the presence of a graphene derivative that exhibits an edge effect.

In one example, 60 mg of asphaltene is refluxed in the surfactant mixture of 2 mL of 0.1 M nitric acid (EMD NX-0409-2) and 18 mL of 0.1 M sulfuric acid (Fischer A300-212). The asphaltene/additive mixture can be refluxed at a temperature of 60° C. for 72 hours (3 days). The pH of the solution is controlled by neutralizing the mixture with 15 mL of 0.1 M NaOH (FISCHER. CAS NO: 1310-73-2) at 90° C. for 2 hrs. Quenching was accomplished by addition of 15 mL of 0.1 M HCl (37.5% CONC.) at a temp of 90° C. for 2 hours yielding a yellowish, liquid gel. This sample is represented as standard and the IR spectra of the class of lastotene produced from such a synthesis is shown in FIG. 7 and FIG. 8.

In a second example, 200 mg of asphaltene was refluxed in additive mixture of 15 mL methanol, 2 mL of 0.1 nitric acid, 15 mL of 0.1M sulfuric acid (Fischer A300-212) at a temp above 60° C. 15 mL of 0.1M of NaOH was added (FISCHER. CAS NO; 1310-73-2) to the mixture at a temp above 60° C. The reaction was quenched by adding 15 mL of 0.1M HCl (37.5% Conc.). This reaction yielded a yellowish, liquid gel. The sample is named ME-NBS and the IR spectra of the class of lastotene produced from this synthesis is shown in FIG. 8.

Microwave Irradiation of Asphaltenes. Asphaltene derivatives can be produced using a dispersant method in combination with microwave irradiation. Microwave processing procedures are disclosed in U.S. Pat. No. 8,747,623, which is incorporated herein by reference in its entirety. Asphaltenes are immersed in an acidic mixture, e.g., nitric acid/sulfonic acid. The suspension is exposed to microwave irradiation. Base is added and the mixture is exposed to microwave irradiation again. After irradiation a quencher, e.g., HCl, is added to the solution and the quenched mixture is again exposed to microwave irradiation.

The products of the dispersant methods are liquid crystalline anisotropic gels or graphene quantum dots. The resulting asphaltene materials can comprise intercalated sulfonic acid oxonium salt or contain methane sulfonic acid or terminal sulfonic acid oxonium salt functional groups. In other aspects the resulting graphene derivative can exhibit discotic and/or calamitic phases.

The products of the dispersant method exhibit a wide range of material properties. Characterization studies indicate the presence of material having dual properties. The dual properties observed in a single product include mechanical, size (small and large PAH), optical (short and long wavelength absorption), shape (rod like and disc like molecules), liquid crystalline phases (discotic and calamitic). Such products are referred to as lastotenes. The lastotene phases may be further separated into two graphene derivatives by a suitable separation technique. Examples of the techniques are chromatography, liquid-liquid extraction, bilayer membrane, distillation, and other separation techniques. The invention envisions the adaption of several techniques for the separation.

Another strategy is to design a method for the separation of these phases from the starting material using dispersant/solvent method.

2. Solvent/Dispersant Method

Another embodiment can be directed to the classification of the dispersant/solvent method as differential method. The separation may be performed before or after the modification stages. The modification may be carried out in one or more stages. While the dispersant method integrates all the additives this technique is involved in the interface of the interphases of asphaltene. The method promotes the reduction of the interfacial tension between phases. It facilitates the formation of barrier between the phases, the barrier may be removed at the terminal of each stage of the process which may result in the production of three materials i.e., crystals, solvent and powder residue.

Embodiments can be directed to the adaption of both dispersant and solvent/dispersant methods of processing. The dispersant/solvent method can comprise the following steps: (i) refluxing an asphaltene-solvent solution or mixture in a surfactant under a given temperature for a given period of time, (ii) adding a modifier e.g., basic solution, (iii) adding a pH controlling agent e.g., an acidic solution, and (iv) quenching the reaction. In certain aspects the quenching the reaction produces a triphasic solution of immiscible components that is composed of powder residue, crystal, and solvent. In certain aspects the dispersant can be an oxidative acid or a mixture of oxidative acids. Unlike dispersant method, the solvent/dispersant method promotes the creation and breaking of a barrier between the phases of the solution. This enables the transforming of materials of different dimension to 2D materials. In other ways, the method facilitates the separation of individual atomic planes from the bulk.

In one embodiment the starting material is mixed with additives in a reflux reactor/mixer to form a slurry or emulsion of functionalized molecules. The emulsion may be removed or be allowed to flow to the modification stage. If removed, it is separated into phases comprising powder residue, crystals and solvents. The modification stage may involve one or more stages. The stages are the modification and control stages. The emulsion phase is modified to alter its surface or interface, this may promote stable layer, and the modified emulsion may either be separated into phases or passed to the control reactor. When required, the modified emulsion is passed to the control reactor to form a controlled solution. Finally, the controlled solution is separated and recrystallized. All the materials i.e., powder residue, crystals and solvents may be isolated and stored. In preferred embodiment the crystal is stored while the solvent and powder residues are recycled in the continuous flow system, this is termed as recycling method.

Another embodiment of the invention relates to the solvent/dispersion for the isolation of 2D crystals from asphaltene emulsions.

Embodiments can be directed to methods that use a dispersant/solvent method. The dispersant/solvent method can comprise the following steps: (i) refluxing an asphaltene-solvent solution or mixture in a surfactant under a given temperature for a given period of time, (ii) adding a modifier e.g., basic solution, (iii) adding a pH controlling agent e.g., an acidic solution, and (iv) quenching the reaction. In certain aspects the quenching the reaction produces a triphasic solution of immiscible components that is composed of powder residue, crystal, and solvent. In certain aspects the dispersant can be an oxidative acid or a mixture of oxidative acids. The triphasic solution product of this invention can be referred to as an elastotene/plastotene emulsion. The powder residue can be separated from the mixture and is referred to as an elastotene/plastotene residue. The remaining biphasic mixture is placed in a recrystallizing solvent at room temperature for the growth of crystals. If necessary, the mixture is subjected to centrifugation before crystal growth. After crystal growth the solvent and crystals are separated. The solvent is referred to as an elastotene solvent. The dried crystal is referred to as an elastotene crystal. In certain aspects, this method is suitable for producing graphene derivatives, liquid crystals, and elastomers.

Figure 32:
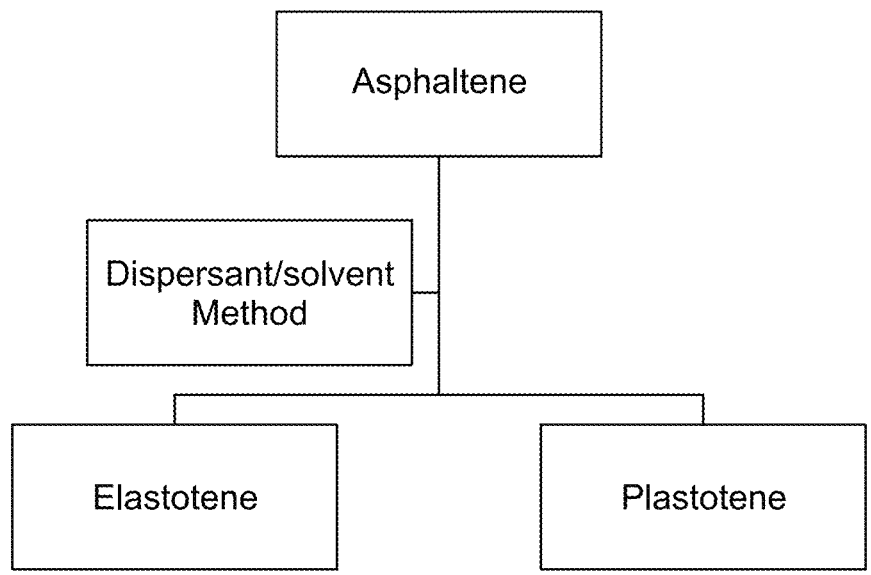
FIG. 32 shows a flow chart for the dispersant/solvent method.
Figure 33:
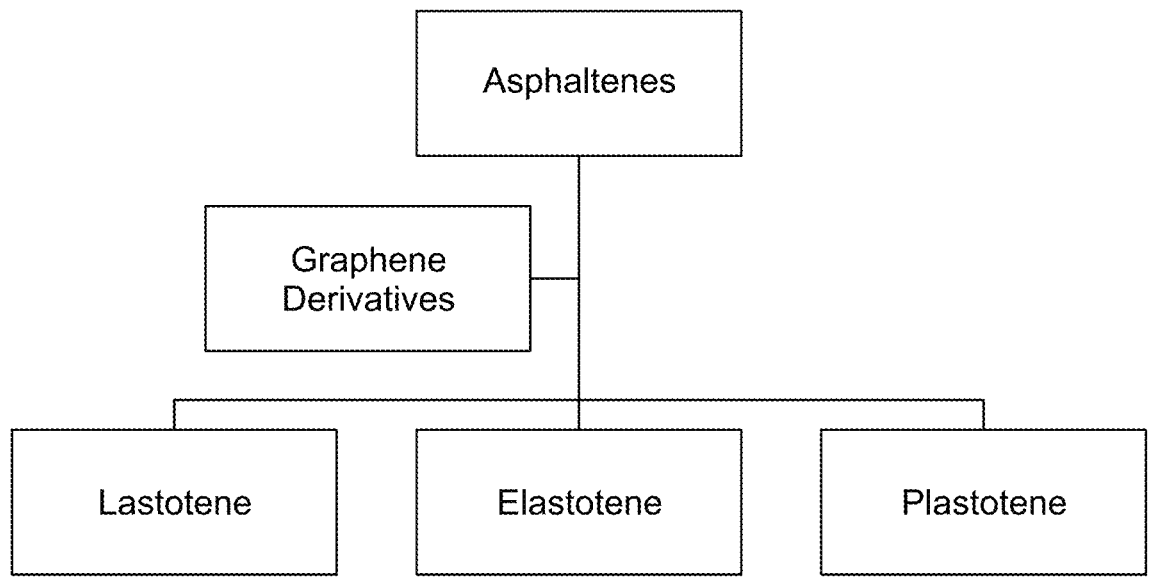
FIG. 33 shows phases and classifications of asphaltene derivatives.

In one embodiment this method may be regarded as a functionalization, oxidation, and reduction process. It involves physisorption and chemisorption at asphaltene-solvent interface, which facilitates conjugation of a fragment of asphaltenes with an active component of the solvent. It facilitates an affinity to asphaltenes which may result in functional groups being absorbed either on the surface of the asphaltene aggregation or become bonded with the polar group of asphaltene molecules, in certain aspects both are likely to occur. In this method, the interaction between asphaltenes and organic salts promotes strong donors of the hydrogen bonding and may also instill stability on asphaltenes structure. The plot of the dispersant/solvent procedure is shown in FIG. 32.

Unlike the dispersant method, where crude asphaltene is used directly, the dispersant/solvent method mix or dissolve the crude asphaltene to obtain an asphaltenic mixture or solution. All other steps and the solvent classification for intercalating agents and surface modifier remain unchanged. In certain aspects, the solvent is mixed with the intercalating agent and the resulting mixture is refluxed in asphaltene.

The introduction of solvents in this method promotes chemisorption and physisorption of molecules of asphaltenes and an active functional group of the solvents. The type of functional group present in the final product is dependent on the choice of solvent.

The solvent is selected from any of organic solvents, polar, polar aprotic, apolar, aromatic, and a mixture thereof. In certain aspects the solvent is selected from benzene, toluene, naphthalene, methanol, distilled water, dichloromethane, chloroform, xylene, dichlorobenzene, dimethylformide, tetrahydrofuran, chlorobenzene, dioxane, ethyl glycerol, alkanes, methylbenzene, ethyl benzene, isopropyl benzene, methyl naphthalene, dimethylsulfoxide, isopropanol, tetrahydrofuran, dimethylformamide, carbon sulfide, 1,2 dichloromethane, acetone, tetrachloromethane, sulfur trioxide, chloroform, dichlorobenzene, and combinations thereof.

In one example of the dispersant/solvent method, asphaltenes are dissolved in benzene to form an asphaltenic solution. An acidic mixture of sulfuric and nitric acid is poured into the asphaltenic solution. The mixture is refluxed at a temp above 60° C. NaOH is added at a temp above 60° C. The mixture is quenched by addition of HCl at a temp above 60° C. The final solution contains an immiscible mixture. The unwanted solid residue is separated and the remaining soluble compound and water is centrifuged. The mixture is then crystallized, which results in the formation of a white precipitate. The crystalline product is washed, purified with organic solvent, and dried.

In a second example, asphaltenes is dissolved in benzene in conjunction with sonication to form an asphaltenic solution. An acidic mixture of sulfuric and nitric acid is poured into the asphaltenic solution and the solution is refluxed at a temp above 60° C. NaOH is added and the temperature raised above 60° C. The reaction is quenched by adding HCl. N-(3-dimethylaminopropyl)-N-ethyl-carbodiimide hydrochloride and N-hydroxysuccinimide were dissolved together in 5 ml of the quenched solution. Poly-L-lysines (PLs) (MW 30,000; Sigma) were added to the suspension to form covalent linkages with the surface carboxylate groups. After incubation of the mixture at room temperature for 24 hours, the amine-terminated solution is thoroughly washed with deionized water and separated by centrifugation. The resulting product is a reduced graphene nanoribbon that is functionalized with amino groups. This product is a member of the elastotenes.

In a third example, benzene and toluene are mixed with a combination of nitric acid and sulfuric acid at a temp above 60° C. Asphaltenes is added and refluxed. NaOH is added at a temp above 60° C. Quenching is completed with the addition of HCl at temp above 60° C. Powder residues are filtered under vacuum. The filtered solution is recrystallized. The resulting crystal is purified with an organic solvent. The product is a member of plastotenes.

In certain aspects asphaltene is transformed into an anisotropic liquid crystalline gel (FIG. 1) that exhibits a distinct combination of two liquid crystalline phases (calamitic and discotic) FIG. 2 and FIG. 3. Other characterization studies (DSC, TEM, Fluorescence microscopy, UV-vis) showed that the gel exhibits a combination of liquid crystalline and graphene properties. In certain aspects the gel is liquid crystalline graphene quantum dots.

The present invention can be used to produce materials that can be applied in water purification, hydrogen production and storage, energy, electronics, sensors, smart materials, military, automobiles, supercapacitors, superconductors, aerospace, pharmaceutical, biotechnologies, cell phones, chemical catalysts cathodes of fuel cells or lithium secondary batteries, high-strength materials, organic semiconductor, conductive resins, shielding materials against electromagnetic waves, probes for scanning tunneling microscopes, field electron emission sources, materials for nano-tweezers, adsorption materials, medical nano-capsules, fibers, cosmetics and health care, information displays, thermography, artificial muscle-like actuators, and enantioselective synthesis heat sinks, sliders, conductive aids for electrodes, catalyst supports, materials for conductive films, thermoelectrics etc.

3. Recycling Method

Embodiment can be directed to a recycling method, which is a one-way method that incorporates both dispersant and the dispersant/solvent methods.

This method is capable of producing each of the products of this disclosure (elastotenes, plastotenes, elastotene/plastotene residue, and elastotene/plastotene emulsion). However, the possible existence of variation between the structures and properties of the products of all the methods necessitates their classification as separate entities.

The reaction may proceed with the application of the dispersant/solvent methods described above and the powder residue mentioned herein undergoes step dispersant/solvent method and dispersant method.

In a first example, the process proceeds with microwave irradiation of asphaltenes. The resulting products are isolated and one portion of the powder residue is used as a starting material for the dispersant/solvent method and the second portion of the powder residue is used in a dispersant method.

In a second example, the process proceeds with the dispersant/solvent method. The resulting products are isolated and the powder residue (elastotene powder) undergoes microwave irradiation process, with the remaining powder residue undergoing the dispersant methodology.

An embodiment of the present invention discloses recycling method for the continuous flow of isolation of individual atomic planes from layered materials. The method enables the recovery and recycling of additives and powder residue of present invention.

Embodiments can be directed to the adaption of both dispersant and solvent/dispersant methods of processing as described above. The recycling method can comprise the following steps: (i) refluxing an asphaltene-additive solution to obtain a refluxed solution; (ii) separating the refluxed solution into phases of solid powder and continuous phase or forming a modified solution by adding modifier; (iii) adding controlling agent to the continuous phase or separating the modifier into phases of powder residue and continuous phase; (iv) if necessary modifying the continuous phase to obtain an assembled solution; (v) recrystallizing the continuous phase to obtain crystalline graphene and solvents; (vi) all the materials may be removed from the reaction otherwise the powder residue and solvent are returned to the reactor for recycling for processing where either solver-dispersant or dispersant method can be adopted. The first reaction is solvent/dispersant method.

In certain aspects the quenching the reaction produces a triphasic solution of immiscible components that is composed of powder residue, crystal, and solvent. In certain aspects the dispersant can be an oxidative acid or a mixture of oxidative acids.

In one embodiment the starting material is mixed with additives in a reflux reactor/mixer to form a slurry or emulsion of functionalized molecules. The emulsion may be removed or allowed to flow to the modification stage. If removed, it may be separated into phases comprising powder phase and continuous phase. Whereas the powder phase is returned to the reactor for processing, the continuous phase may either be passed to the next stage or isolated for recrystallization into crystals and solvent.

In certain aspect modification may involve one or more stages. The stages are the modification and control stages. The emulsion/continuous phase is modified to alter its surface or interface, this may promote stable layer, the continuous phase may either be isolated and be recrystallized or be passed to the control reactor. The modified emulsion may either be separated into phases or passed to the control reactor. When required, the modified continuous/emulsion is passed to the control reactor to form a controlled solution. Finally, both two controlled solutions are separated and recrystallized. All the materials, i.e., powder residue, crystals and solvents may be isolated and stored. In preferred embodiment the crystal is stored while the solvent and powder residues are recycled in the continuous flow system.

In one embodiment this method may be regarded as a functionalization, oxidation, and reduction process. It involves physisorption and chemisorption at asphaltene-solvent interface, which facilitates conjugation of a fragment of asphaltenes with an active component of the solvent. It facilitates an affinity to asphaltenes which may result in functional groups being absorbed either on the surface of the asphaltene aggregation or become bonded with the polar group of asphaltene molecules, in certain aspects both are likely to occur. In this method, the interaction between asphaltenes and organic salts promotes strong donors of the hydrogen bonding and may also instill stability on asphaltenes structure. The plot of the dispersant/solvent procedure is shown in FIG. 32.

The introduction of solvents in this method promotes chemisorption and physisorption of molecules of asphaltenes and an active functional group of the solvents. The type of functional group present in the final product is dependent on the choice of solvent.

The solvent is selected from any of organic solvents, polar, polar aprotic, apolar, aromatic, and a mixture thereof. In certain aspects the solvent is selected from benzene, toluene, naphthalene, methanol, distilled water, dichloromethane, chloroform, xylene, dichlorobenzene, dimethylformide, tetrahydrofuran, chlorobenzene, dioxane, ethyl glycerol, alkanes, methylbenzene, ethyl benzene, isopropyl benzene, methyl naphthalene, dimethysulfoxide, isopropanol, tetrahydrofuran, dimethylformamide, carbon sulfide, 1,2 dichloromethane, acetone, tetrachloromethane, sulfur trioxide, chloroform, dichlorobenzene, and combinations thereof.

In one example of the dispersant/solvent method, asphaltenes are dissolved in benzene to form an asphaltenic solution. An acidic mixture of sulfuric and nitric acid is poured into the asphaltenic solution. The mixture is refluxed at a temp above 60° C. NaOH is added at a temp above 60° C. The mixture is quenched by addition of HCl at a temp above 60° C. The final solution contains an immiscible mixture. The solid residue is separated and the colloid solution is washed and mixed with water by centrifugation. Recrystallization is allowed for 2 hrs to produce crystals and solvent.

In a second example, asphaltenes is mixed with additives benzene, nitric acid and sulfuric acid at 80° C. to form an asphaltene solution. NaOH is added to the solution at 60° C. The reaction is quenched by adding HCl. N-(3-dimethylaminopropyl)-N-ethyl-carbodiimide hydrochloride and N-hydroxysuccinimide were dissolved together in 5 ml of the quenched solution. Poly-L-lysines (PLs) (MW 30,000; Sigma) were added to the suspension to form covalent linkages with the surface carboxylate groups. After incubation of the mixture at room temperature for 24 hours, the amine-terminated solution is thoroughly washed with deionized water and separated by centrifugation.

In a third example, benzene and toluene are mixed with a combination of nitric acid and sulfuric acid at a temp above 60° C. Asphaltenes is added and refluxed. NaOH is added at a temp above 60° C. Quenching is completed with the addition of HCl at temp above 60° C. Powder residues are filtered under vacuum. The filtered solution is recrystallized. The resulting crystal is purified with an organic solvent.

In one embodiment the invention relates to the utilization of products derived from the methods for the derivatization of asphaltene and production of graphene derivatives. In certain aspect by products and products of present invention are utilized as additives, modifying agents, solvents and controlling agent.

In certain aspects asphaltene is transformed into an anisotropic liquid crystalline gel (FIG. 1) that exhibits a distinct combination of two liquid crystalline phases (calamitic and discotic) FIG. 2 and FIG. 3. Other characterization studies (DSC, TEM, Fluorescence microscopy, UV-vis) showed that the gel exhibits a combination of liquid crystalline and graphene properties. In certain aspects the gel is liquid crystalline graphene quantum dots.

The present invention can be used to produce materials that can be applied in water purification, hydrogen production and storage, energy, electronics, sensors, smart materials, military, automobiles, supercapacitors, superconductors, aerospace, pharmaceutical, biotechnologies, cell phones, chemical catalysts cathodes of fuel cells or lithium secondary batteries, high-strength materials, organic semiconductor, conductive resins, shielding materials against electromagnetic waves, probes for scanning tunneling microscopes, field electron emission sources, materials for nano-tweezers, adsorption materials, medical nano-capsules, fibers, cosmetics and health care, information displays, thermography, artificial muscle-like actuators, and enantioselective synthesis heat sinks, sliders, conductive aids for electrodes, catalyst supports, materials for conductive films, thermoelectrics, etc.

In a second example, the process proceeds with the dispersant/solvent method. The resulting products are isolated and the powder residue (elastotene powder) undergoes microwave irradiation process, with the remaining powder residue undergoing the dispersant methodology.

Further methods of processing of asphaltenes and types of asphaltenes that are incorporated herein for all purposes of the processing can be found in U.S. Pat. Nos. 8,389,853 and 7,811,444; U.S. patent publications 20130220421 and 20130040520; PCT publication WO/2011/13750.

C. Asphaltene Derivatives

Asphaltenes can be used to synthesize an anisotropic gel or liquid crystal. The gel can comprise an alkane, sulfonic acid, oxonium salt, aromatic center, electron withdrawing terminal groups, electron accepting terminal groups, and/or elastomeric structures. In certain aspects the gel is a discotic liquid crystal. Discotic liquid crystals take advantage of the proximity of the aromatic mesogens to allow charge transfer in the stacking direction through the $\pi$ conjugate systems. The charge transfer allows the discotic liquid crystals to be electrically semiconductive along the stacking direction. Discotic liquid crystals can be used in photovoltaic devices, organic light emitting diodes (OLED), molecular wires, and the like. In a further aspect the gels can be in the form of calamitic liquid crystals. Calamitic or rod-shaped molecules show a large difference in length and breadth, thus delivering anisotropy. A typical calamitic mesogen consists of a rigid core unit, ensuring the anisotropic character, together with flexible side chains, which provide stabilizing effects within the liquid crystal phases. The rigid core is mostly aromatic and polar end groups are common. The physical properties can be widely influenced by the nature of the core and the side chains, allowing engineering of molecules for a specific purpose.

A mesogen is the fundamental unit of a liquid crystal that induces structural order in the crystals. Typically, a liquid-crystalline molecule consists of a rigid moiety and one or more flexible parts. The rigid part (polyaromatic core) aligns molecules in one direction, whereas the flexible parts (side chains) induce fluidity in the liquid crystal. This rigid part is referred to as a mesogen, and it plays a crucial role in the molecule. In a calamitic liquid crystal, the mesogen is a rod-like structure composed of two or more aromatic and aliphatic rings connected in one direction. In a discotic liquid crystal, the flat-shaped aromatic core that makes molecules stack in one direction is defined as the mesogen. These rod-like and disk-like structures are formed not only by covalent bonds, but also by non-covalent interactions, such as hydrogen bonds, ionic interactions, and metal coordination. In such cases, key structures that define the macromolecular shapes of the assembled molecules are called mesogens or mesogenic parts.

The present invention discloses a method of processing of single crystals, nano graphene and its derivatives, graphene quantum dots, graphene nanoribbons, liquid crystals, elastomers, pharmaceutical salts, methane sulfonic acid and its derivatives, alkyl sulfonic acid and its derivatives from asphaltene.

The method may be suitable for the functionalization of materials such as hydrocarbons, nanomaterials, polymers, mesomorphic compounds, composites.

Any of these methods (dispersant, dispersant/solvent, recycling) can be used to functionalize materials. In another context, the methods can be used as synthesizer of liquid crystalline and or elastomeric material from different class of materials that may include polymers, nanomaterial, polycyclic aromatic hydrocarbons, resins, and composites. For example The dispersant/solvent method can be used to synthesized a liquid crystalline compound with a terminal 1,4 methyl sulfonic acid oxonium salt from hexa benzocoronene (HBC).

Surprisingly, asphaltene structure exhibits a unique composition of exotic materials. It exhibits multifunctional materials that can be used to synthesize existing and new class of materials.

Certain embodiments are directed to asphaltene derivatives that consist of all components of asphaltene and the elements of all the additives. This class of asphaltene derivative exhibit two graphene derivatives, metals and functional groups in its structures. In certain aspect it is a quantum dot material exhibits dual phases comprising rod and disc like molecules. In addition to metals and functional groups, fullerene and nanotube molecules are observed in its structure. It may be regarded as nanobud nanobubble quantum dot. The quantum dot material exhibits a wide range of properties that may include remarkable fluorescence, ballistic transport, and ballistic properties.

Certain embodiments are directed to single crystalline compounds that exhibit unique and unusual structural compositions and properties that are used for the characterization of liquid crystalline and graphene materials. The uniquely fluorescence potential and asymmetric unit formula of these derivatives of asphaltene are novel.

An embodiment of the invention relates to a single atomic layer of carbon that exhibit acetylenic linkages. Like graphene, this material exhibits two dimensional structures however the existence of double and triple bonded carbon atoms between corner atoms indicates a new class of 2D carbon allotropes of graphene. Further analysis indicates two categories of single crystalline materials. Further observations indicate the formation of several derivatives of this class of graphene derivatives of this invention.

Another embodiment of the invention relates to a single atomic layer of graphene that exhibit double and single bonded carbon structures. This single crystalline derivative of the invention exhibits a proclivity to roll into carbon nanotube.

Further details of this new class of carbon allotropes of graphene can be found in the publications (Qing Peng et al Nanotechnology, Science and Applications 2014: 7 1-29).

In another embodiment, a new class of 2D complex oxides is disclosed.

Certain embodiments of the invention relates to the disclosures of several processing techniques that include method of producing 2D carbon allotropes of graphene, method for unfolding of fullerene molecules, method for unrolling carbon nanotubes, method for transforming asphaltene into graphene and its derivatives, method for producing 2D materials.

In one embodiment, the invention discloses a 2D carbon allotropes of graphene that show the proclivity of the molecules to fold into a caged like structure (Fullerene).

In one aspect the single crystalline materials are two dimensional carbon allotropes of graphene. The composition of graphene structures and liquid crystalline properties may instill remarkable properties in the graphene derivatives.

In certain aspects the crystal can have one or more of an aromatic core, anisotropic structures, elastomeric structures, an electron donor terminal group, an electron acceptor terminal group, supramolecular network of hydrogen bonded structures, discotic molecules, calamitic molecules, arm chair edges, zig-zag edges, side chain crosslinking, and main chain cross linking.

In one embodiment the asphaltene derivatives are derivatized to produce another derivatives which are treated to generative other derivatives. In certain aspect the invention is a regenerative invention.

In one embodiment the products of the invention are functional materials that can be selected from any of organic materials, inorganic materials, organometallic, surface active materials, biomaterials, surface active nanomaterials, carbon and any combination thereof.

In one embodiment the product of this invention includes functional materials like sulfonic acids and their derivatives, benzene derivatives, surfactants, liquid crystals, crystals, elastomers, plastomers, discotic liquid crystals, calamitic liquid crystals, composites, complex oxides, single crystals and any combination thereof.

Another embodiment describes the asphaltene derivatives as carbon allotropes and their derivatives.

In one embodiment the products of this invention are graphene and its derivatives of graphene. In certain aspect the derivatives of graphene derivatives are disclosed.

In one embodiment the asphaltene derivatives are 2D single crystalline carbon allotropes of graphene. In certain aspect the derivatives of 2D single crystalline carbon allotropes of graphene are disclosed.

In another embodiment the single crystalline derivative of the invention is a graphene derivative.

Asphaltenes can be used to synthesize an anisotropic gel or liquid crystal from asphaltenes. The gel can comprise an alkane, sulfonic acid, oxonium salt, aromatic center, electron withdrawing terminal groups, electron accepting terminal groups, and/or elastomeric structures.

Certain embodiments are directed to asphaltene derivatives that consist of all components of asphaltene and the elements of all the additives. This class of asphaltene derivative exhibit two graphene derivatives, metals and functional groups in its structures. In certain aspect it is a quantum dot material exhibits dual phases comprising rod and disc like molecules. In addition to metals and functional groups, fullerene and nanotube molecules are observed in its structure. It may be regarded as nanobud nanobubble quantum dot. The quantum dot material exhibits a wide range of properties that may include remarkable fluorescence, ballistic transport, and ballistic properties.

Certain embodiments are directed to single crystalline compounds that exhibit unique and unusual structural compositions and properties that are used for the characterization of liquid crystalline and graphene materials. The uniquely fluorescence potential and asymmetric unit formula of these derivatives of asphaltene are novel.

In one embodiment the single crystal graphene material exhibits an asymmetric unit formula of dinitrobenzene. The synthesis of a nitro functionalized graphene may provide a path for tuning the structure of graphene with desirable substituent group.

Another embodiment of the invention relates to the adoption of continuous flow devices that are employed for the derivatization of benzene and sulfonation processes.

An embodiment of the invention relates to a single atomic layer of carbon that exhibit acetylenic linkages. Like graphene, this material exhibits two dimensional structures however the existence of double and triple bonded carbon atoms between corner atoms indicates a new class of 2D carbon allotropes of graphene. Further analysis indicates the formation of two categories of 2D single crystalline materials that differ in terms of their proclivity to assemble into dimensions. They also differ in terms of bonding or linkage.

Further observations indicate the formation of several derivatives of this class of graphene derivatives of this invention.

Another embodiment of the invention relates to a single atomic layer of graphene that exhibit double and single bonded carbon structures. This single crystalline derivative of the invention exhibits a proclivity to roll into carbon nanotube.

Further details of this new class of carbon allotropes of graphene can be found in the publications (Qing Peng et al Nanotechnology, Science and Applications 2014: 7 1-29).

In another embodiment, a new class of 2D complex oxides is disclosed.

Certain embodiments of the invention relates to the disclosures of several processing techniques that include method of producing 2D carbon allotropes of graphene, method for unfolding of fullerene molecules, method for unrolling carbon nanotubes, method for transforming asphaltene into graphene and its derivatives, method for producing 2D materials.

In one embodiment, the invention discloses a 2D carbon allotropes of graphene that show the proclivity of the molecules to fold into a caged like structure (Fullerene).

In one aspect the single crystalline materials are two dimensional carbon allotropes of graphene. The composition of graphene structures and liquid crystalline properties may instill remarkable properties in the graphene derivatives.

Another embodiment of the invention discloses an asphaltene derivative.

In certain aspects the crystal can have one or more of an aromatic core, anisotropic structures, elastomeric structures, an electron donor terminal group, an electron acceptor terminal group, supramolecular network of hydrogen bonded structures, discotic molecules, calamitic molecules, arm chair edges, zig-zag edges, side chain crosslinking, and main chain cross linking.

In one embodiment the asphaltene derivatives are derivatized to produce other derivatives which are treated to generative other derivatives. In certain aspect the invention is a regenerative invention.

In one embodiment the products of the invention are functional materials that can be selected from any of organic materials, inorganic materials, organometallic, surface active materials, biomaterials, surface active nanomaterials, carbon and any combination thereof.

In one embodiment the product of this invention includes functional materials like sulfonic acids and their derivatives, benzene derivatives, surfactants, liquid crystals, crystals, elastomers, plastomers, discotic liquid crystals, calamitic liquid crystals, composites, complex oxides, single crystals and any combination thereof.

Another embodiment describes the asphaltene derivatives as carbon allotropes and their derivatives.

In one embodiment the products of this invention are graphene and its derivatives of graphene. In certain aspect the derivatives of graphene derivatives are disclosed.

In one embodiment the asphaltene derivatives are 2D single crystalline carbon allotropes of graphene. In certain aspect the derivatives of 2D single crystalline carbon allotropes of graphene are disclosed.

In another embodiment the single crystalline derivative of the invention is a graphene derivative.

The invention envisions the use of devices for the continuous flow of the derivatization of asphaltene. In certain aspect the invention envision the adaptation of devices for the continuous flow derivatization aromatic compounds, derivatization of benzene, nitration and sulfonation processes.

Certain embodiments are directed to a single crystal exhibiting liquid crystalline properties, oxidized graphene properties, graphene nanoribbon properties and the like. In certain aspects the crystal can have one or more of an aromatic core, anisotropic structures, elastomeric structures, an electron donor terminal group, an electron acceptor terminal group, supramolecular network of hydrogen bonded structures, discotic molecules, calamitic molecules, arm chair edges, zig-zag edges, side chain crosslinking, and main chain cross linking.

Other embodiments are directed to a single crystal that comprises a shock-absorber like superlattice structure, elastomers, sulfonic acid derivatives, alkyl, sulfonic acid, methyl, oxonium salts, elastomeric structure, and/or an aromatic core.

Further explanations on the functionalization techniques, definition and uses of graphene, graphene quantum dots, graphene nanoribbons, liquid crystals, elastomeric liquid crystals which are hereby incorporated herein in their entirety for all purposes are reported in (Cincotto et al., 2014, *Chem. Eur. J.,* 20, 4746-4753; Nakada et al., 1996, *Phys. Rev. B,* 54, 17954-17961; Ishida et al., 2008, *Angew. Chem. Int. Ed.,* 47, 8241-8245; Xie and Zhang, 2005, *J. Mater. Chem.,* 15, 2529-2550).

The present invention discloses a method of the production of single crystals, graphene and its derivatives, graphene quantum dots, graphene nanoribbons, liquid crystals, elastomers, pharmaceutical salts, methane sulfonic acid and its derivatives, alkyl sulfonic acid and its derivatives from asphaltene.

D. Graphene Compositions

The methods and compositions described herein can be used to convert asphaltene into graphene. Graphene exhibits a unique 2-D structure and exceptional electrical, physical, and chemical properties. It is a sheet of carbon having a one-atom thickness. This two-dimensional nanomaterial is composed of $sp^2$-bonded carbon atoms. Its physical configuration imparts various properties like extreme electrical conductivity at room temperature. Graphene also exhibits a number of extraordinary electronic, optical, thermal and mechanical properties. Graphene is a strong yet bendable and stretchable material. It is transparent since it only absorbs a few percent of visible light that hits it. Graphene is a zero-gap semiconductor or zero-overlap semimetals since unlike semiconductors it does not have a threshold for electronic excitations. Graphene has a negative thermal expansion coefficient, a high optical phonon frequency, and high thermal conductivity. Bio-sensing systems are made possible due to the quantum confinement and edge effect of the graphene structure. Asphaltenes can be processed to produce graphene, graphene derivatives and functional materials. Asphaltenes can be processed by altering the concentration, temperature, pressure, amount of water, and selection of additives to produce different polymorphs of the graphene derivatives, such as, 0D, 1D, and 2D carbon allotropes. The lattice of the structure of the single crystals can exist in different polymorphs, like orthorombic, monoclinic, and triclinic. Also zig-zag and arm chair graphene nanoribbons (GNRs) can be produced.

Graphene can be folded into 0D molecules known as Fullerene, it can be rolled into 1D molecules known as carbon nanotubes. Other derivatives of graphene are new two-dimensional (2D) carbon allotropes of graphene, nanobud, graphene composites, graphene quantum dots, graphene flakes, graphene platelets, graphene nanoribbons.

This new class of single crystalline 2D carbon allotropes of graphene include: graphone, graphyne, graphdiyne, graphone. Graphyne and Graphdyne exhibits double and triple carbon bonds in their structure. Graphyne structure contains one acetylenic linkages while graphdiyne exhibits two acetylenic linkages. Both Graphone and Graphane are a class of hydrogenated graphene, graphane is a fully hydrogenated graphene while graphone is a 50% hydrogenated graphene.

Fullerene represents 0D carbon derivative of graphene. It is a caged molecule which is produced when graphene is folded. It exhibits a disc like structure (spherical). A product of this invention that exhibit fullerene structure is the powder residue that is analyzed as functionalized fullerene composites (FFC).

Carbon Nanotube is a 1D carbon derivative of graphene. It is a rod like material that exists in the form of tubular object. It is formed by rolling graphene. A product of this invention that exhibits tubular structure is the powder derivative that is analyzed as functionalized nanotube composite (FNC).

Nanobud is a derivative of graphene that exhibits both carbon nanotube and fullerene molecules in its structure. Its derivatives include functionalized quantum dots.

Graphene Nanoribbons are graphene layers or sheets with ultra-thin width (<50 nm). Graphene nanoribbons exhibit two edge states that are classified as zigzag and armchair (Fujita et al., 1996, *J. Phys. Soc. Japan,* 65, 1920). These edge states exhibit electron and photon states impart unique properties to graphene nanoribbons.

Despite the huge potentials of asphaltene in various technologies, it is faced with many challenges that include cost of production, limited availability, lack of quality and lack of a chemical method for producing scalable and tunable graphene. A major problem is the lack of ON-OFF characteristics.

In one embodiment the asphaltene derivatives are carbon allotropes and their derivatives.

In one embodiment the asphaltene derivatives are graphene and its derivatives of graphene.

In one embodiment the asphaltene derivatives are 2D materials that comprising any of but not limited to carbon materials, inorganic materials, hydrides, oxides and any combination thereof.

In one embodiment the asphaltene derivatives are 2D carbon allotropes of graphene. In certain aspect they are 2D single crystalline carbon allotropes of graphene.

One embodiment of this invention relates to a cheap tunable method of producing scalable graphene and its derivatives. In certain aspect the asphaltene derivatives are new class of 2D carbon allotropes of graphene. In certain aspect the transformation of an unwanted material into graphene derivatives may narrow the time line for graphene market.

Another embodiment of this invention relates to the characterization results of the graphene products. The results revealed the existence of the combination of liquid crystalline, fluorescence and elastomeric properties which may confer a range of properties that will make the products a top choice for selection in diverse technology.

Due to the liquid crystalline properties of the graphene materials the ON-OFF characteristics are instilled. Properties like magnetic, mechanical, optical, electrical, electronics, pharmaceutical may also be instilled.

Functional Materials are categorized as those materials that exhibit particular properties and functions on their own. They include nanomaterials, organic materials, quantum dots, surface active materials, aromatic compounds, inorganic materials, metals, hydrides, hybrids, carbon materials, biomaterials, 2D materials and any combination thereof.

Quantum Dots comprise of nanocrystalline colloidal semiconductor particles with a radius 1-50 nanometers. They are neither atomic nor bulk semiconductors, but small enough to exhibit quantum mechanical properties. The physical properties of the quantum dots depend of their size. A size smaller than their exciton Bohr radius leads to quantum confinement due to spatial confinement of electrons and holes due to the dimensions of the material. As a consequence the optical and electronic properties of the quantum dots are different than those of bulk semiconductors and of discrete molecules. The band gap energy of these semiconductor materials and their absorption and emission wavelength depends on the particle or nanocrystal size—the quantum dot can be tuned by changing the size of the particles. As the size of the nanoparticles decrease the semiconductor band gap energy increases. As the size of the nanoparticles becomes bigger than their exciton Bohr radius their properties become more like the bulk semiconductors.

Graphene Quantum Dots (GQDs) are defined as a 0D material with a combination of characteristics derived from both graphene and carbon quantum dots (CDs). GQDs are regarded as an incredibly small piece of graphene. When 2D graphene sheets are converted into 0D graphene quantum dots, they exhibit new phenomena due to quantum confinement and edge effects (Ritter and Lyding, 2009, *Nature Materials,* 8, 235-242). The surrounding barriers such as irregularities in the edge are responsible for the confined states in GQDs.

In one embodiment the invention relates to the by-product of the invention. In certain aspects the by-products are functional materials. These functional materials exist in liquid and crystalline form.

Another embodiment describes the functional materials as benzene derivatives, sulfonic acid and its derivative, nitro benzene and its derivatives, 2D crystals, liquid crystals, surfactants, acidic compounds, salts, ionic liquids, cationic materials, anionic materials, amphiphile, elastomers, plastomers, lastomers, liquid crystals, single crystals.

In one embodiment the invention recognizes the generation of a wide range of materials and their derivatives. In certain aspects the invention categorized the products and their derivatives in terms of their shape and dimensions.

Elastotene is coined for a class of the product of present invention that exhibits 0D materials (caged/fullerene molecules) or disc like molecule (spherical objects) in its structure. It may exist in the form of crystals, powder, films. It is a single crystalline graphene derivative that exhibits a discotic liquid crystalline phase. It may be regarded as a material that is functionalized with electron withdrawing and/or electron donor groups. In certain aspects the structure of this discotic liquid crystalline material exhibits elastomeric properties. Elastotene may exist in form of powder or liquid.

Plastotene is coined for a class of the product of present invention that exhibits 1D materials (nanotubes) in its structure. It may exist in the form of crystals, powder, films. It may also be classified as a crystalline graphene derivative that exhibits calamitic liquid crystalline properties. It may be regarded as a material that is functionalized with electron withdrawing groups and/or electron donor groups. In certain aspect the structure of this crystalline material exhibits plastic properties. Plastotene may exist in form of powder or liquid.

An embodiment of the invention relates to a hybrid nanocomposite material and its derivatives. The name Lastotene is coined for a class of the product of present invention that exhibits both disc like and rod like molecules in its structure. A product of present invention that exhibits hybrid structure i.e., any combination of 0D, 1D, 2D and 3D materials is termed as Lastotene. Examples of Lastotene are nanobud quantum dots, nanobubble, nanobud composites.

Nimota is coined for the new class of 2D derivatives of present invention. As a result of its regenerative tendencies this class of material is further classified into further classified into E-Nimota (2D derivatives of 0D materials), P-Nimota (2D derivatives of 1D), L-Nimota (2D derivatives of lastotene), A-Nimota (2D derivatives of Azix).

Figure 17:
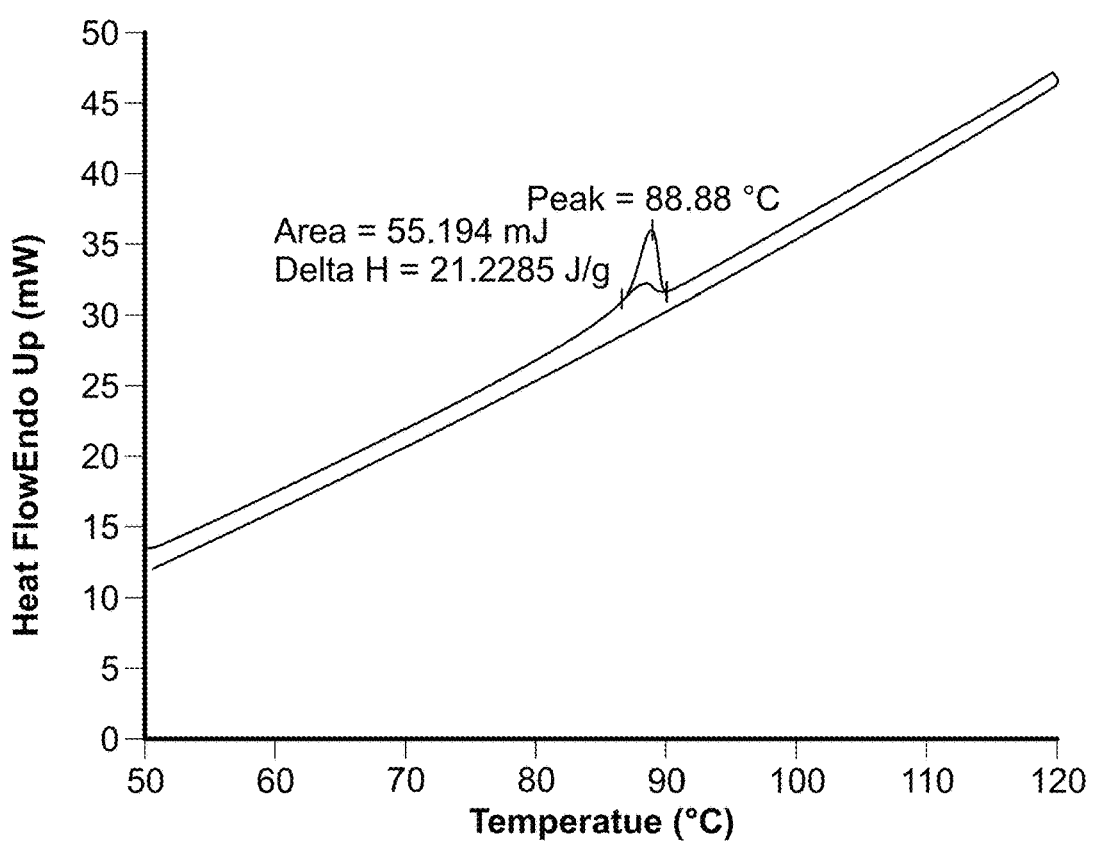
FIG. 17 displays the DSC plot of the synthesized 2D graphene allotropes ($C_6H_4N_2O_4$) from asphaltenes demonstrating the presence of liquid crystalline phase in the crystal.
Figure 18:
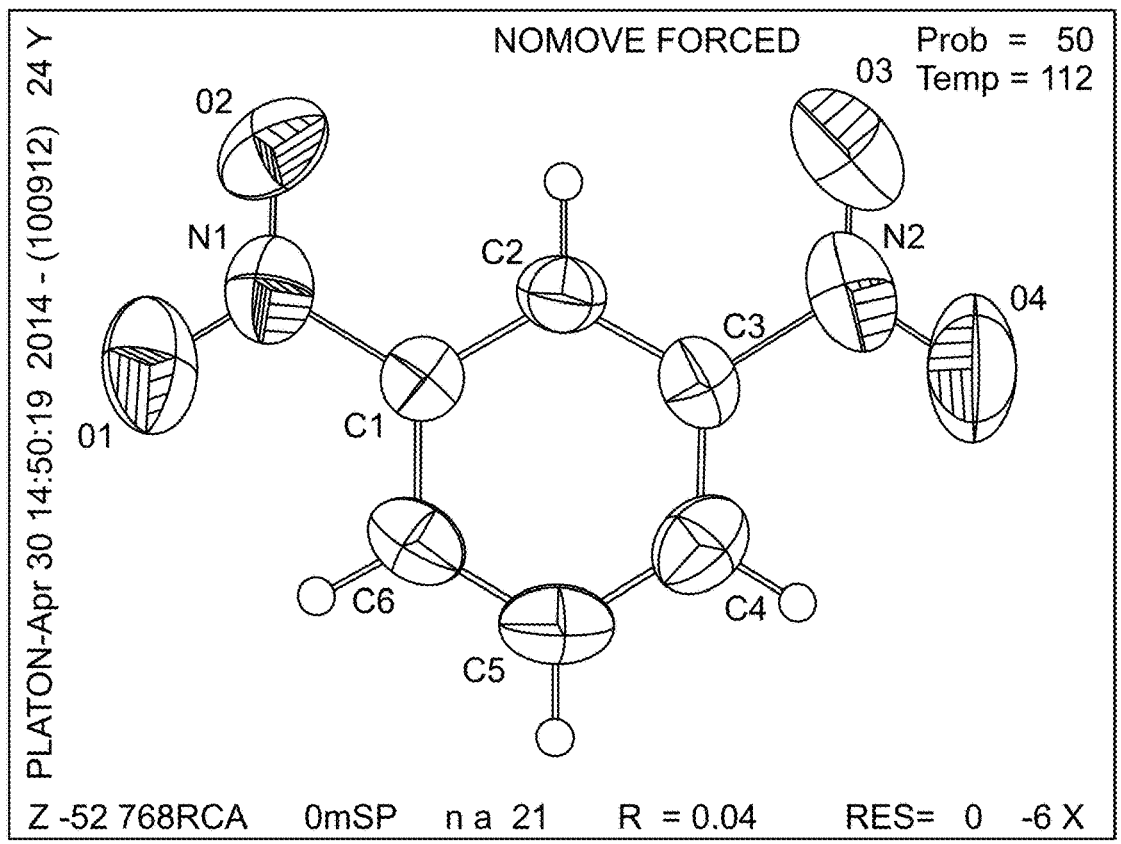
FIG. 18 demonstrates the molecular structure ($C_6H_4N_2O_4$) of the synthesized crystal drawn with 50% probability displacement ellipsoids obtained from a crystallography study. It indicates that the synthesized material is a single crystal that exhibits a side chain elastomer.

An example of E-Nimota is shown in FIG. 18, the image represents the asymmetric unit of a single crystalline graphene with asymmetric unit compound formula $C_6H_4N_2O_4$. Analysis of the characterization results (FIG. 14-FIG. 21) of this single crystalline graphene indicates that it is a discotic liquid single crystalline 2D carbon derivative of graphene. It is a side chain crosslinking monotropic material. Analysis of the products of this class of graphene derivatives indicates the formation of ordered structures through interactions of alkyl side chains of graphene. A member of elastotene includes a nitro derivative functionalized graphene, e.g., nitro functionalized graphenes derivative, nitromethyl functionalized graphene derivative.

Figure 22:
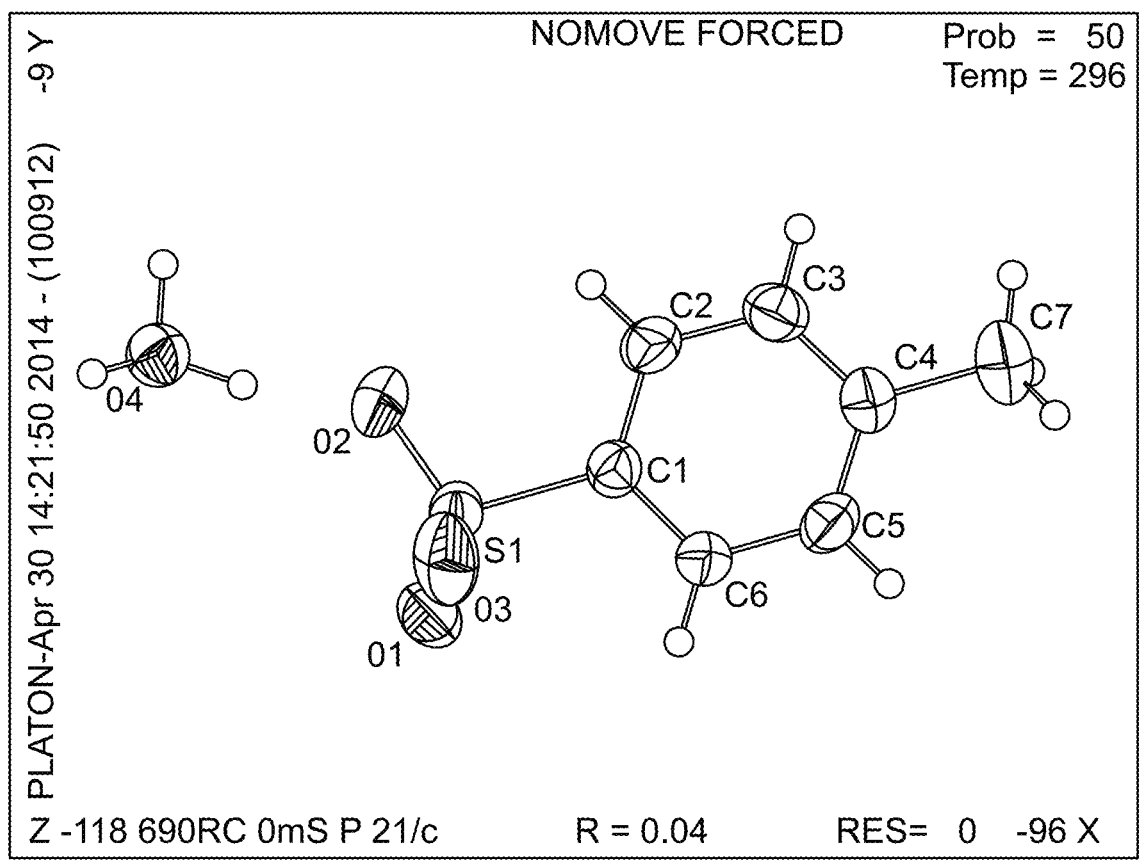
FIG. 22 shows the asymmetric unit of the single crystalline graphene. The unit structure is $C_7H_{10}O_4S$ drawn with 50% probability displacement ellipsoids obtained from a crystallography study.
Figure 23:
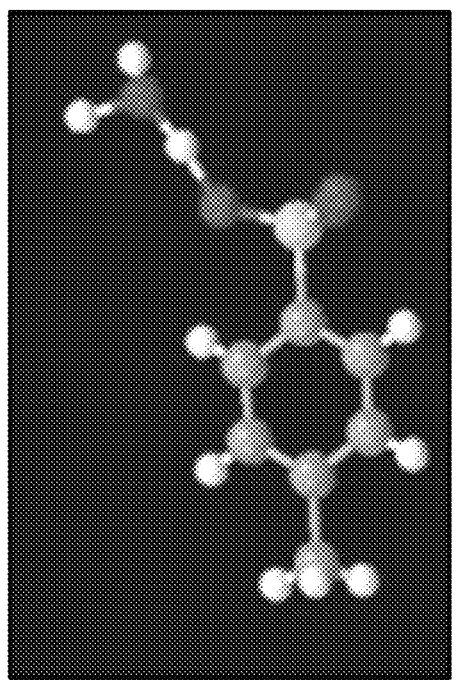
FIG. 23 Images of asymmetric unit (left) and Lattice structure of $C_7H_{10}O_4S$.
Figure 23:
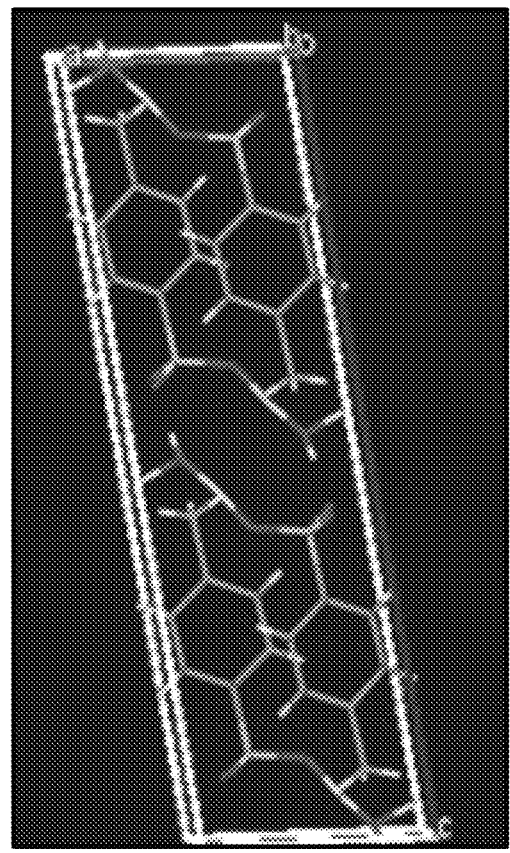

An example of P-Nimota is shown in FIG. 22 and FIG. 23, the image represents a single crystalline graphene derivative with an asymmetric unit of $C_7H_{10}O_4S$. Analysis of the characterization results of this class of graphene derivative (FIG. 22-FIG. 29) indicates that it is a calamitic liquid single crystalline 2D carbon allotropes of graphene. Analysis of the products of this class of graphene derivatives indicates the formation of ordered structures through π-π interactions of planar fused polycyclic aromatic rings of graphene. Members of P-Nimota include acidic salts functionalized graphene e.g., alkyl sulfonic acid oxonium salt functionalized graphene derivative, ethyl sulfonic acid functionalized graphene derivative, aminoethyl sulfonic acid functionalized graphene derivatives.

The 3D products of this invention are classified as Azix.

In another embodiment the structural composition of lastotene may include carbon nanotube, Fullerene, metals, polymers, and functional groups.

Lastotene may be classified as a class of graphene derivatives that demonstrates a distinct feature of exhibiting dual phases. This unique property is displayed in FIGS. 1&2 demonstrating the presence of a disk-like molecule and a rod like molecule in the structure of a graphene quantum dots synthesized from asphaltenes. In certain aspects lastotene may be regarded as either an oxidized graphene quantum dots or reduced graphene quantum dots that exhibits both liquid crystal and plastomer properties. The structure of lastotene is functionalized with electron withdrawing groups and/or electron donor groups. Characterization results of this class of material can be found from FIG. 1-FIG. 13.

Figure 6:
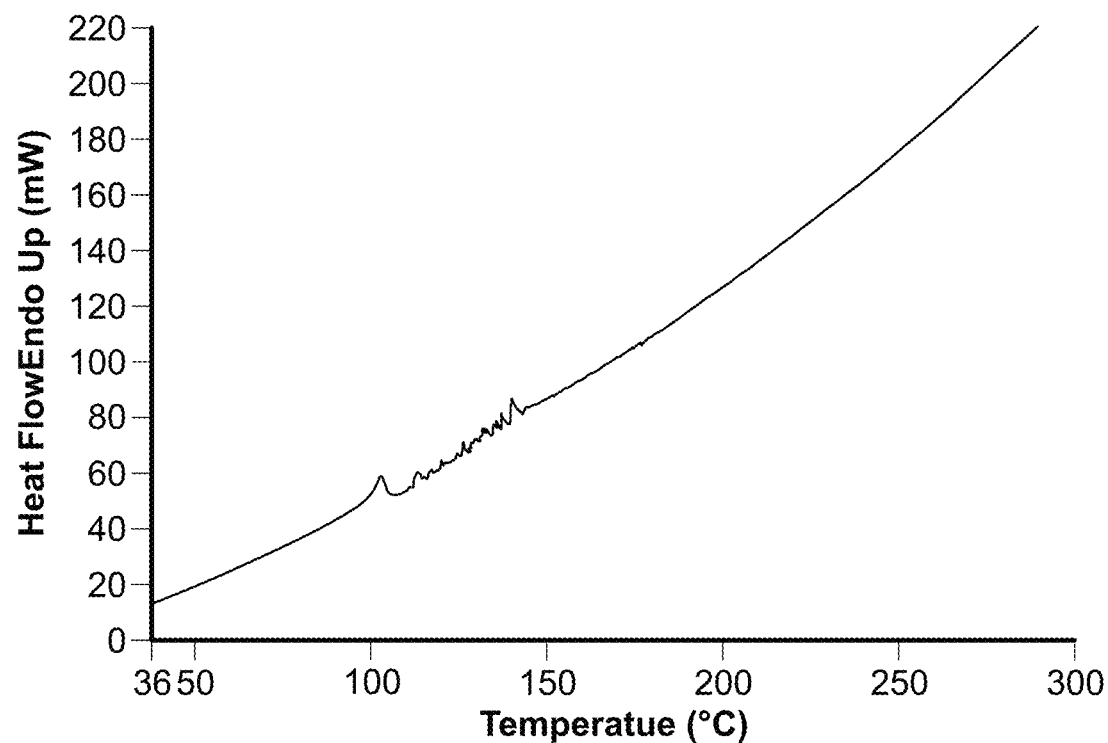
FIG. 6 a DSC phase plot of the synthesized quantum dots showing the presence of two phases. It also demonstrates its liquid crystalline properties.
Figure 9:
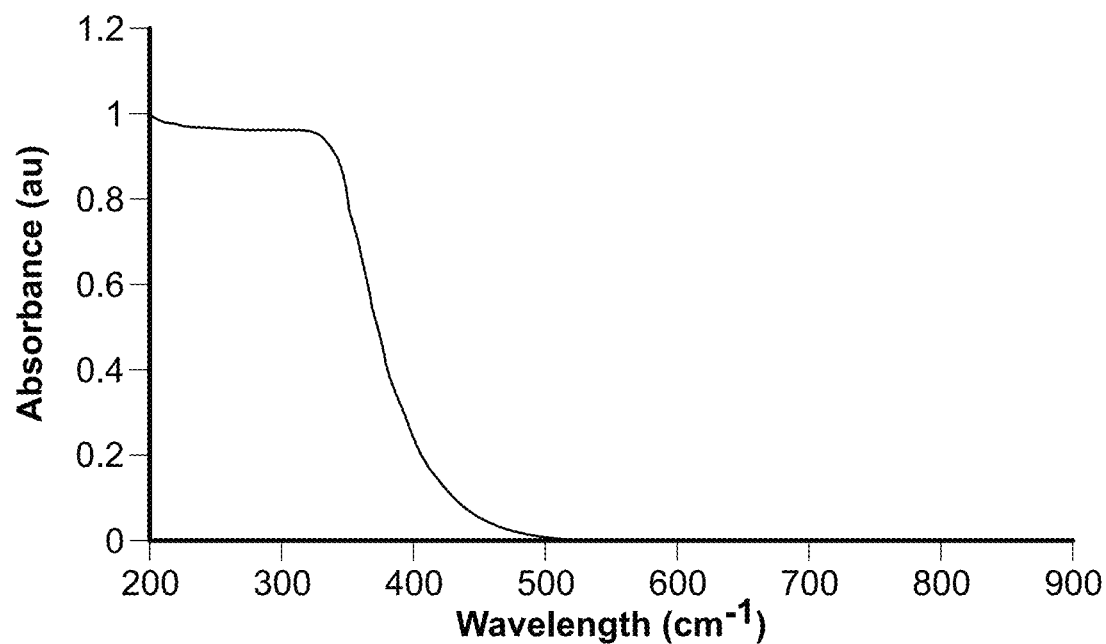
FIG. 9 shows the optical absorption of a synthesized quantum um dots. The result demonstrates the ability of the synthesized quantum dots to emit all visible lights.

Characterization results of one of the synthesized samples of lastotenes indicates that this class of graphene quantum dots material exhibits both liquid crystalline and plastomeric properties. The synthesized material is highly soluble in water. As shown in FIG. 6 and FIG. 9, this class of material exhibits two liquid crystalline phases (discotic and calamitic) and also demonstrates an ability to emit all visible wavelengths of light (see FIG. 9, FIG. 12, and FIG. 13).

TABLE 1

The exposure time at which fluorescence occurs at different wavelength for the samples of lastotene.

| Sample | DAPI | FITC | CY 3 |
|---|---|---|---|
| STANDARD | 1.5 s | 4.0 s | 3.0 s |
| STANDARD + dichloromethane | 780 ms | 550 ms | 300 ms |
| STANDARD + Xylene | 1.6 s | 480 ms | 4 s |

Table 1 suggests that lastotene can be engineered to exhibit short and/or long emission quenching time. Lastostene may include graphene quantum dots that is functionalized with acidic salts e.g., a sulfonic acid oxonium salt intercalated nanographene material.

Lastotene/Elastotene/Plastotene solvents refer to a Brønsted ionic acid liquid, a Brønsted ionic basic ionic liquid, and combinations thereof. It is an ionic liquid that is capable of extracting functional materials from asphaltenes at room temperature under sonication, centrifugation, and/or stirring. The compound can be a pharmaceutical salt, sulfonic acid and its derivatives, e.g., besylates, mesylate, tosylates, nitrosulfonic acid oxonium salt, methyl sulfonic acid oxonium salt, amino sulfonic acid, amino sulfonic acid oxonium salt etc. It is not a graphene material but it is a functionalized PAH material. These solvents are used in various aspects of the methods described herein—they can be recovered after the completion of the synthesis and are also reusable. All mixtures in the experimental procedures that exclude asphaltenes are regarded as the solvent of the product.

Elastone/Plastotene Emulsions refer to an immiscible solution comprising all other components of this invention. Elatostene emulsion can comprise all elastotene solvents, elastotene powders, or other elastotenes.

Elastotene/Plastotene powders refer to a functionalized powder residue of this invention.

In general liquid crystals (LCs) are unique materials that exhibit interesting properties. Characteristics of liquid crystals are partly those of a crystalline solid and partly those of a conventional liquid. The molecules in the solid state are highly ordered and have very little translational freedom whereas the molecules in the liquid state do not have any intrinsic order. In liquid crystals the molecules tend to point along a common axis but liquid crystal may flow like liquid. The liquid crystals generally have rod like molecular structure and strong dipole and/or polarizable substituents.

The liquid crystalline state or phase is known as a mesomorphic state or mesophase, which is an intermediate between isotropic liquid phase and anisotropic crystal phase. There are several mesomorphic states or phases and the most common phases are nematic phases, smectic phases, and cholesterolic phases. In the nematic phases the molecules do not have positional order but they tend to point in the same direction. In the smectic phase the molecules, along with orienting along a common axis also, tend to align themselves in layers and planes. Cholesteric phase, often called chiral nematic phase, is composed of nematic molecules containing a chiral center.

The properties of LCs vary with the type of functional groups. Liquid crystals exhibit similar behavior with other birefringent materials the only difference being that the atoms and molecules within crystals are fixed and are able to move collectively.

An embodiment of the invention relates to the instilment of liquid crystalline properties on the synthesized graphene derivatives. This is expected to provide a solution to one of the most challenges of graphene. The present of dipoles in the synthesized graphene derivative of present invention can induce ON-OFF behavior.

II. EXAMPLES

The following examples as well as the figures are included to demonstrate preferred embodiments of the invention. It should be appreciated by those of skill in the art that the techniques disclosed in the examples or figures represent techniques discovered by the inventors to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention.

Example 1

Asphaltene Preparation

Numerous methods of processing asphaltene sources (e.g., crude oil) are recognized in the art. The extraction of asphaltene process includes precipitation and purification. One of the extraction process employed for the production of asphaltene from crude oil is given below Materials—Maya crude oil, Heptane (99.8% purity, Toluene (99.9% purity), glass wares, paper filters (40 microns), Nitric acid (EMD NX-0409-2), Sulfuric acid (Fischer A300-212), NaOH (Fischer. Cas No: 1310-73-2), HCl (37.5% Conc.).

Precipitation—Asphaltenes are extracted from crude oil: 100 ml of thoroughly mixed crude oil was dissolved in four liters of heptane and subjected to magnetic stirring for 48 hours at room temperature. The homogeneous mixture was filtered (40 μm filter paper) and rinsed using toluene. The product solution was collected in recrystallization dishes and kept for drying under a hood for 24 hours. About 14 g of dried impure (crude) asphaltene was collected.

Purification—The collected crude asphaltene was dissolved in 400 ml of toluene and placed on a magnetic stirrer for 5 hours, using filter paper no. 40 to separate mixtures. In this case, the purified asphaltene was passed through the filter paper, while the impurities remained on the filter. The collected purified asphaltene solution was poured in to a large beaker and allowed to dry under a hood for 24 hours at room temperature. The result is a black shiny compound (asphaltene).

Example 2

Derivatization of Asphaltene (Nanobud Quantum Dot)

Figure 10:
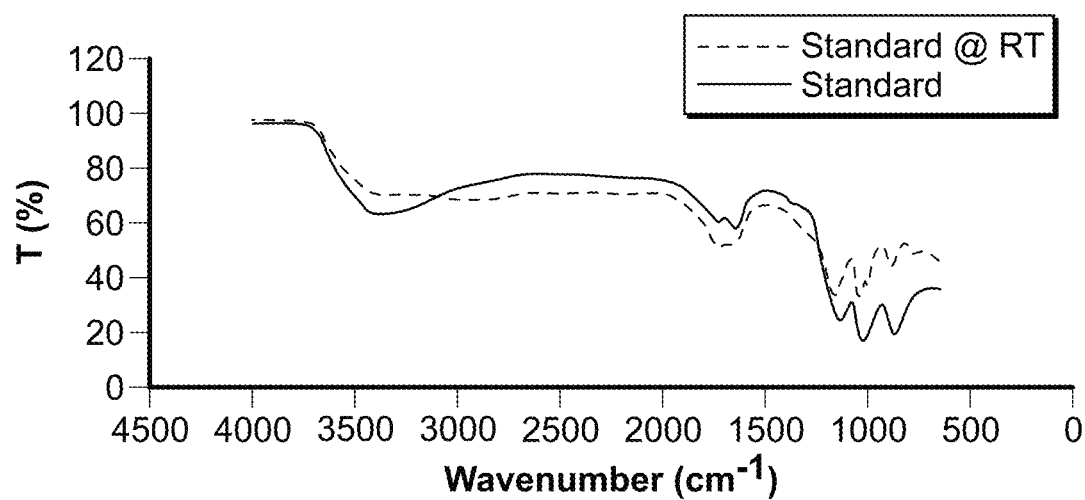
FIG. 10 shows the infra-red (IR) spectroscopy plot of synthesized quantum dots material at room temp and at 60° C.

A mixture of 5 ml of nitric acid and 45 ml of sulfuric acid was refluxed with 200 mg of asphaltene at 60° C.±10 for 3 days, this will generate defects on the surface of asphaltene. The diluted NaOH was added and incubated at 95° C.±5 for 2 hours and quenching was completed with the addition of 0.01 M HCl at 95° C.±5 for 2 hours. This reaction yielded a yellowish, liquid gel. The purification of the mixed solution is done by filtration, centrifugation etc. The product of this synthesis is a highly water soluble class of graphene quantum dots that belongs to the lastotenes. The IR spectra of the lastotene produced from this synthesis is shown in FIG. 10. (standard).

Example 3

Derivatization of Asphaltene (Nanobud Quantum Dot)

5 ml of nitric acid and 45 ml of sulfuric acid was mixed at 80° C.±10 for 3 days. 25 ml of 0.01 M NaOH was reacted with the mixture at 90° C.±5 for 2 hours and quenching was completed with the addition of 25 ml of 0.01 M HCl at 95° C.±5 for 2 hours. The final solution is referred to as a lastotene solvent. The solvent is used as a solvent for ultrasonication of asphaltene. 20 mg of asphaltenes was immersed in 50 ml of the solvent solution. Ultrasonication of the resulting mixture was carried out for 2 hours. The mixed solution is separated by filtration. The product of this synthesis belongs to the lastotenes. The IR spectra of the lastotene obtained from this synthesis is shown in FIG. 10. (RT)

Example 4

Figure 11:
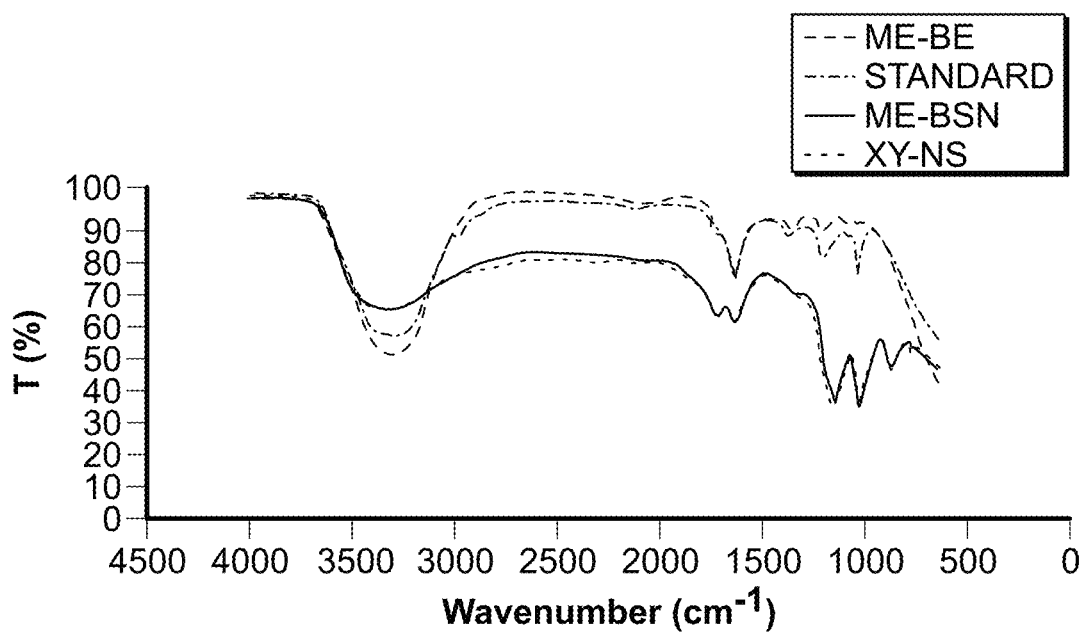
FIG. 11 shows IR plot of the effect of reacting solvents on the synthesized quantum dots material. ME-NS (addition of methanol to the standard reaction), ME-B-NS (addition of methanol and benzene to the standard reaction), or XY-NS (addition of xylene to the standard reaction). The four plots demonstrate similarity in the functional groups that are present in their structures.
Figure 12:
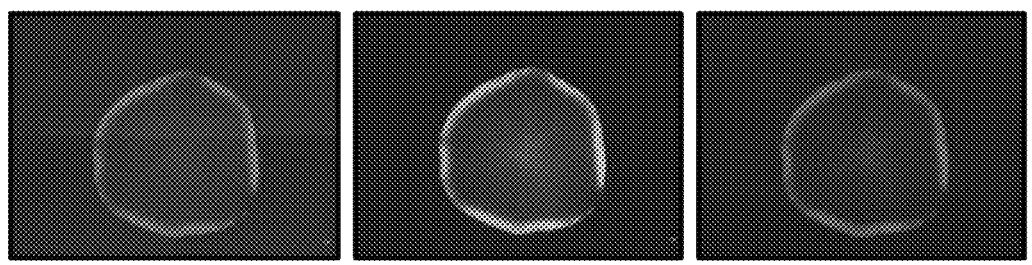
FIG. 12 shows fluorescence microscopy images of a synthesized anisotropic quantum dots material.
Figure 13:
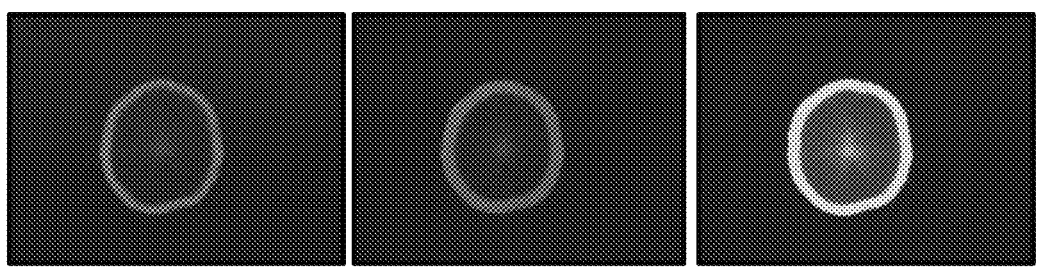
FIG. 13 demonstrates similarity in fluorescence behavior when the standard reaction is modified with the addition of methanol.
Figure 14:
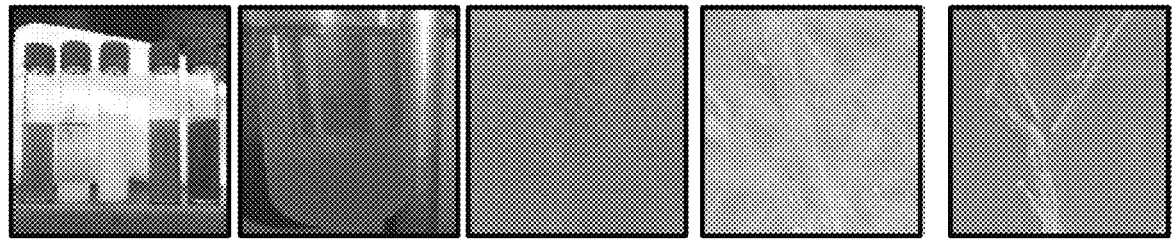
FIG. 14 shows images of a synthesized crystal from asphaltenes from L-R: recrystallization stages with a nitro-functionalized solution of asphaltenes with different solvents, solution of liquid crystals showing phase separation, synthesized fibrous crystal, needle like crystalline network of fibers, and alignment of crystals.
Figure 15:
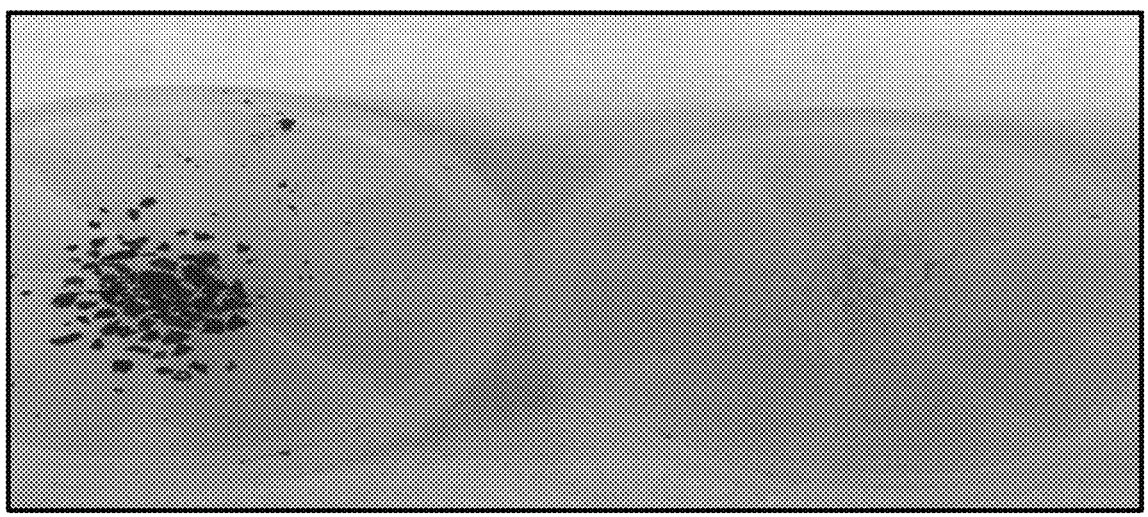
FIG. 15 shows images of starting compound asphaltenes (left) and synthesized network of fibrous crystal (right).

Derivatization of Asphaltene 200 mg of asphaltene was dissolved in 25 ml of benzene and 25 ml of methanol was added to the solution. The resulting mixture was refluxed in 50 ml of sulfuric acid at 80° C.±10 for 3 days. 25 ml of 0.01 M NaOH was reacted with the mixture at 95° C.±5 for 2 hours and quenching was completed with the addition of 25 ml of 0.01 M HCl at 95° C.±5 for 2 hours. This reaction yielded a yellowish, liquid gel. The purification of the mixed solution is done by filtration, centrifugation etc. The product of this synthesis belongs to the plastotenes. The IR spectra of the elastotene produced from this synthesis is shown in FIG. 11 (MBS).

Example 5

Derivatization of Asphaltene

Synthesis of graphene quantum dots from microwave irradiation of asphaltenes. 200 mg of asphaltenes were immersed in an acidic mixture of 5 ml of nitric acid and 50 ml of sulfonic acid, the resulting suspension was exposed to microwave irradiation at 70° C. for between 10-30 minutes. 25 ml of 0.01 molar concentration of NaOH was added to the resulting solution and the new mixture is exposed to microwave irradiation at 90° C. for between 2-5 minutes thereafter, 25 ml of 0.1 M HCl was added to the solution and the final mixture was exposed to microwave irradiation at 90° C. for between 2-5 minutes. The product of this synthesis belongs to the lastotenes.

Example 6

Derivatization of Asphaltene

A mixture of 25 mL dichloromethane, 5 mL of nitric acid and 45 mL of sulfuric acid was refluxed with 200 mg of asphaltenes at 60° C.±10 for 3 days. The solution was neutralizing with diluted NaOH at 95° C.±5 for 2 hours and quenching was completed with the addition of 0.01 M HCl at 95° C.±5 for 2 hours. This reaction yielded a yellowish, liquid gel. The purification of the mixed solution is done by filtration, centrifugation etc. The product of this synthesis belongs to the plastotenes.

Example 7

Derivatization of Asphaltene

A mixture of 25 ml xylene, 5 ml of nitric acid and 45 ml of sulfuric acid was refluxed with 200 mg of asphaltenes at 60° C.±10 for 3 days. The pH of the solution was controlled by neutralizing the mixture with diluted NaOH at 95° C.±5 for 2 hours and quenching was completed with the addition of 0.01 M HCl at 95° C.±5 for 2 hours. This reaction yielded a yellowish, liquid gel. The purification of the mixed solution is done by filtration and centrifugation with distilled water. The product of this synthesis belongs to the plastotenes. The purification of the mixed solution is done by filtration and centrifugation. The product of this synthesis belongs to the lastotenes. The IR of this sample is represented as XY in FIG. 11

Example 8

Derivatization of Asphaltene

A mixture of 25 mL distilled water, 25 mL of acetone, 5 mL of nitric acid and 45 mL of sulfuric acid was refluxed with 200 mg of asphaltenes at 60° C.±10 for 3 days. The pH of the solution was controlled by neutralizing the mixture with diluted NaOH at 95° C.±5 for 2 hours and quenching was completed with the addition of 0.01 M HCl at 95° C.±5 for 2 hours. This reaction yielded a yellowish, liquid gel. The purification of the mixed solution is done by filtration. The product of this synthesis belongs to the lastotenes.

Example 9

Figure 19:
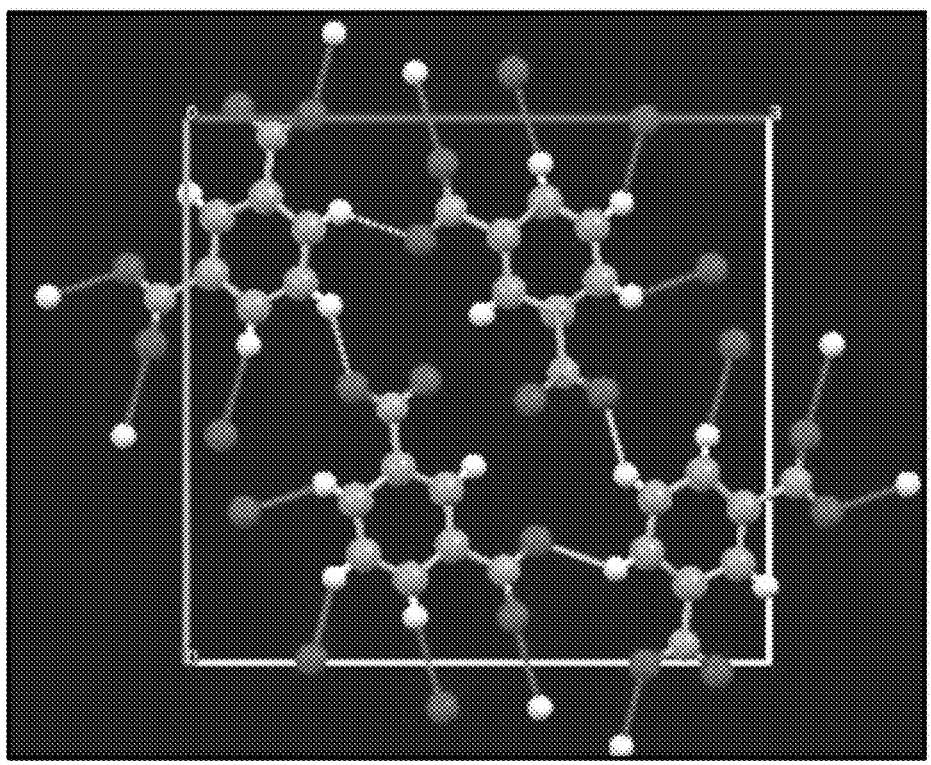
FIG. 19 shows the packing system of ($C_6H_4N_2O_4$) in the lattice atoms, showing the hydrogen atoms on the aromatic ring and the nitro groups on adjacent molecules.
Figure 20:
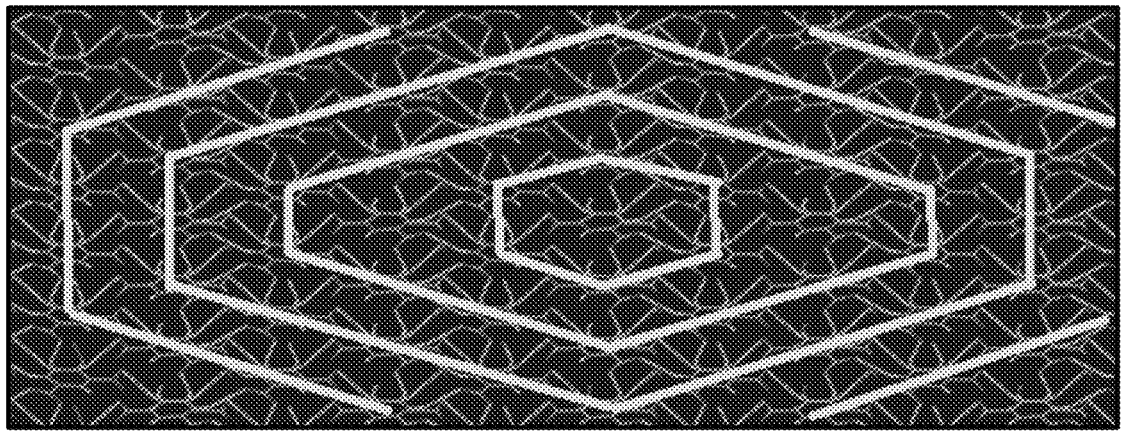
FIG. 20 shows the supramolecular structure of the synthesized $C_6H_4N_2O_4$ when viewed down the section, it displays the layers formed by C—H . . . O interactions between hydrogen bonded network and nitro group oxygen atoms of adjacent molecules. The single crystal displays a proclivity to the formation of graphene nanoribbons. It is a liquid single crystalline elastomeric graphene nanoribbon.
Figure 21:
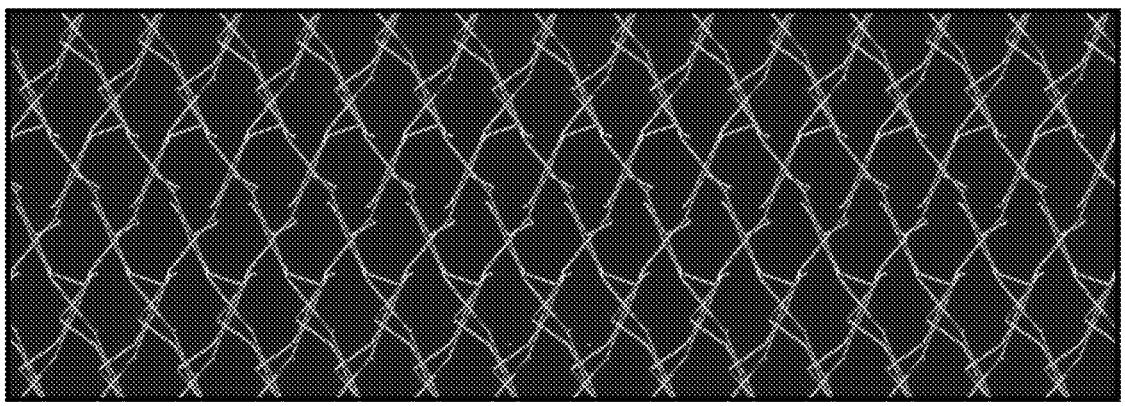
FIG. 21 shows a view down the b axis of a section of the $C_6H_4N_2O_4$ layers formed by C—H . . . O interactions between hydrogen. It also shows atoms on the aromatic ring and the nitro groups on adjacent molecules. The anisotropic structure exhibits a side chain cross linking.

Derivatization of Asphaltene 200 mg of asphaltene was dissolved in 30 ml of benzene via sonication for 10 minutes. An acidic mixture of sulfuric and nitric acid was poured into the asphaltenic solution under continuous stirring. The mixture was refluxed at 80° C.±10° C. for three days. For the control of pH and removal of carboxylic acid, 30 ml of 0.1 M NaOH was added and the temperature was raised to 90° C.±10° C. for 30 minutes and the mixture was quenched by 30 ml of 0.1 M HCl at 90°±10° C. for 30 minutes. The final solution contains an immiscible mixture. A dark solid residue which accounts for 80° C.±10° C. of the starting compound was isolated from the compound by passing it through a 40 μm filter paper under vacuum and a mixture of 50 ml of the remaining soluble compound and 100 ml of distilled water was centrifuged at 500 rpm for 10 minutes under extensive rinsing with distilled water. The new product is a white precipitate. The precipitate is dried and purified with diethyl ether. The powder residue is analyzed as plastotene, while the recovered solvent is analyzed as nitrobenzene. The dried precipitate is a fibrous single crystalline material that is analyzed as a liquid single crystalline elastomeric graphene nanoribbon and named as E-Nimota crystal in this invention. The lattice structure of this single crystalline graphene derivative is shown in FIG. 19 and the asymmetric unit of this class of this E-Nimota crystal is provided by Cambridge Crystallographic Data Centre. The data have been assigned the deposition number: CCDC 999621; Formula: C6H4N2O4; Unit Cell Parameters: a 14.079(8) b 13.267(8) c 3.813(2) Pna21 and a molecular weight of 168.11 gmol$^{-1}$.

Example 10

Derivatization of Asphaltene 200 mg of asphaltenes was dissolved in 30 mL equally mixed toluene and chlorobenzene via sonication for 10 minutes. 30 ml of acidic mixture of sulfuric was poured into the asphaltenic solution under continuous stirring. The whole mixture was refluxed at 80° C.±10° C. for three days. For the control of pH and removal of carboxylic acid, 30 ml of 0.1 M NaOH was added and the temperature was raised to 90° C.±10° C. for 30 minutes and the mixture was quenched by 30 ml of 0.1 M HCl at 90° C.±10° C. for 30 minutes. The final solution contains an immiscible mixture. A dark solid residue which accounts for 80° C.±10° C. of the starting compound was isolated from the compound by passing it through a 40 μm filter paper under vacuum and a mixture of 50 ml of the remaining soluble compound and 100 ml of distilled water was centrifuged at 500 rpm for 10 minutes under extensive rinsing with distilled water. The powder residue is analyzed as elastotene, while the recovered solvent is analyzed as sulfonic acid derivative. The new product is a white precipitate. The precipitate is dried and purified with diethyl ether. The dried precipitate is a fibrous single crystalline material that is analyzed as a liquid single crystalline elastomeric graphene nanoribbon and it belong to the P-Nimota of this invention.

Example 11

Derivatization of Asphaltene 200 mg of asphaltenes was dissolved in 30 ml benzene via sonication for 10 minutes. An acidic mixture of sulfuric and nitric acid was poured into the asphaltenic solution under continuous stirring. The whole mixture was refluxed at 80° C.±10° C. for three days. For the control of pH and removal of carboxylic acid, 30 ml of 0.1 M NaOH was added and the temperature was raised to 90° C.±10° C. for 30 minutes and the mixture was quenched by 30 ml of 0.1 M HCl/Tin solution at 90° C.±10° C. for 30 minutes. After incubation of the mixture at room temperature for 24 h, the amine-terminated solution were thoroughly washed and separated by centrifugation. The new product is a reduced graphene nanoribbon that is functionalized with amines. It belongs to E-Nimota.

Example 12

Figure 30:
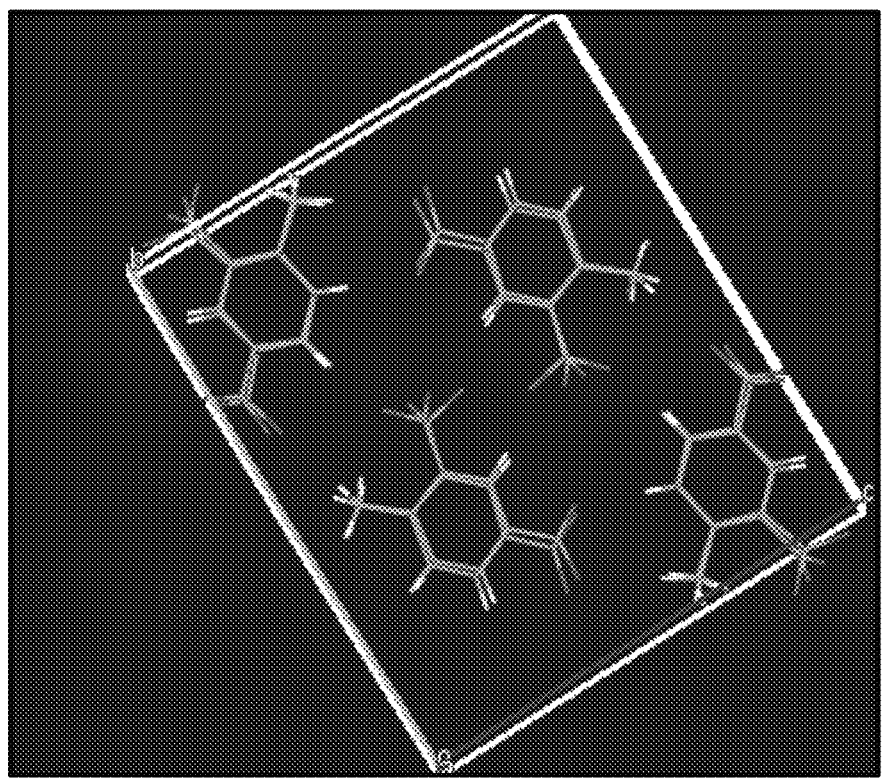
FIG. 30 shows the lattice structure of $C_7H_6N_2O_4$.

Derivatization of Asphaltene 200 mg of asphaltenes was dissolved in 30 ml of toluene via sonication for 10 minutes. An acidic mixture of sulfuric and nitric acid was poured into the asphaltenic solution under continuous stirring. The whole mixture was refluxed at 80° C.±10° C. for three days. For the control of pH and removal of carboxylic acid, 30 ml of 0.1 M NaOH was added and the temperature was raised to 90° C.±10° C. for 30 minutes and the mixture was quenched by 30 ml of 0.1 M HCl at 90° C.±10° C. for 30 minutes. The final solution contains an immiscible mixture. A dark solid residue which accounts for 80° C.±10° C. of the starting compound was isolated from the compound by passing it through a 40 μm filter paper under vacuum and a mixture of 50 ml of the remaining soluble compound and 100 ml of distilled water was centrifuged at 500 rpm for 10 minutes under extensive rinsing with distilled water. The new product is a white precipitate. The precipitate is dried and purified with diethyl ether. The dried precipitate is a fibrous single crystalline material that is analyzed as a liquid single crystalline elastomeric graphene nanoribbon and named as elastomeric crystal. It belongs to the E-Nimota. The isolated dark powder residue is named as elastotene powder. The recovered solvent is analyzed as tosylate oxonium salts. The lattice structure of this single crystalline graphene material is shown in FIG. 30 and the asymmetric unit of this class of this elastotene is provided by Cambridge Crystallographic Data Centre. The data have been assigned the deposition number: CCDC 10025; Formula: C7H6N2O4; Unit Cell Parameters: a 8.125(2) b 15.176(4) c 12.977(3) P21/c; molecular weight; 180.11 gmol$^{-1}$.

Example 13

Derivatization of Asphaltene 200 mg of asphaltenes were dissolved in 30 ml benzene/methanol mixture and the resulting solution was immersed in an acidic mixture of 5 ml of nitric acid and 45 ml sulfonic acid, the resulting suspension was exposed to microwave irradiation for 10 minutes. 0.001 molar concentration of NaOH was added to the resulting solution and the new mixture is remaining exposed to microwave irradiation for 50 seconds thereafter, 0.001 molar concentration of HCl was added to the solution and the final mixture was exposed to microwave irradiation for 50 seconds. The mixtures are separated by isolating the powder residue (plastotene powder) via filtration. The remaining mixtures are separated by centrifugation and extensively rinsed. The new product is a white precipitate. The precipitate is dried and purified with diethyl ether. The dried precipitate is a fibrous material that is analyzed as single crystal and it belongs to the elastotenes. The asymmetric unit is shown in FIG. 18.

Example 14

Figure 16:
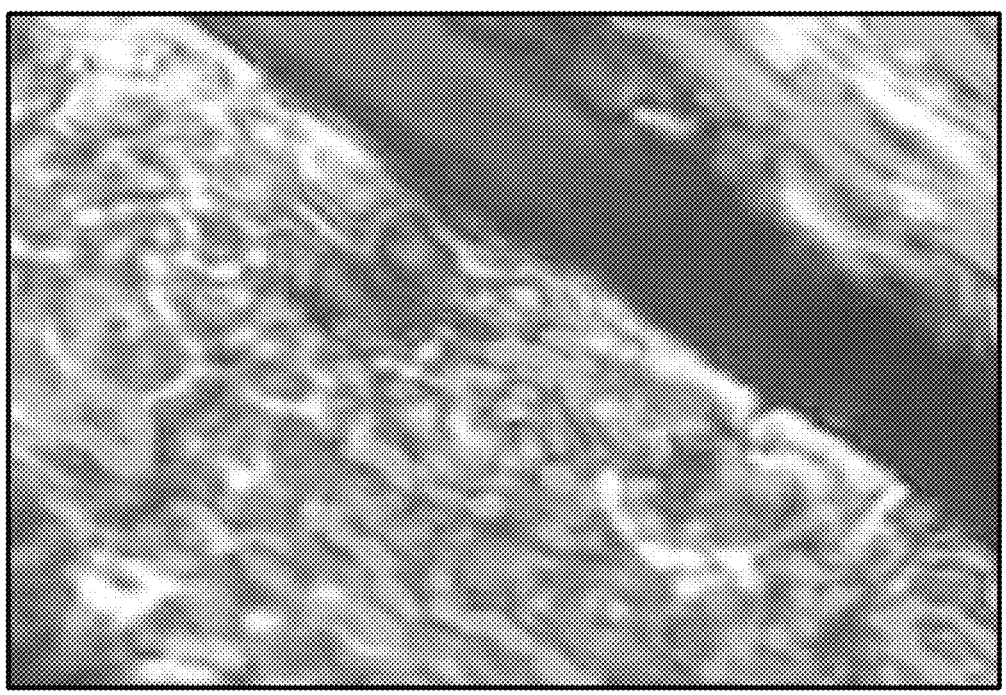
FIG. 16 features the birefringence behavior of the synthesized 2D graphene allotropes $C_6H_4N_2O_4$ when viewed under a polarizer. The result indicates that the crystal exhibits an anisotropic structure.

Derivatization of Asphaltene 200 mg of asphaltenes was dissolved in 30 ml benzene/methanol mixture via sonication for 10 minutes. An acidic mixture of sulfuric and nitric acid was poured into the asphaltenic solution under continuous stirring. The mixture was refluxed at 80° C.±10° C. for three days. For the control of pH and removal of carboxylic acid, 30 ml of 0.1 M NaOH/methanol was added and the temperature was raised to 90° C.±10° C. for 30 minutes and the mixture was quenched by 30 ml of 0.1 M HCl/THF solution at 90° C.±10° C. for 30 minutes. After incubation of the mixture at room temperature for 24 hours, the nitro-terminated solution were thoroughly washed and separated by centrifugation. The new product is a liquid single crystalline graphene nanoribbon that is functionalized with amines. It belongs to the plastotenes. The birefringence and the DSC plot of this crystal are shown in FIG. 16 and FIG. 17, respectively.

Example 15

Figure 24:
FIG. 24 displays the birefringence property of $C_7H_{10}O_4S$ when viewed under a polarizer.
Figure 25:
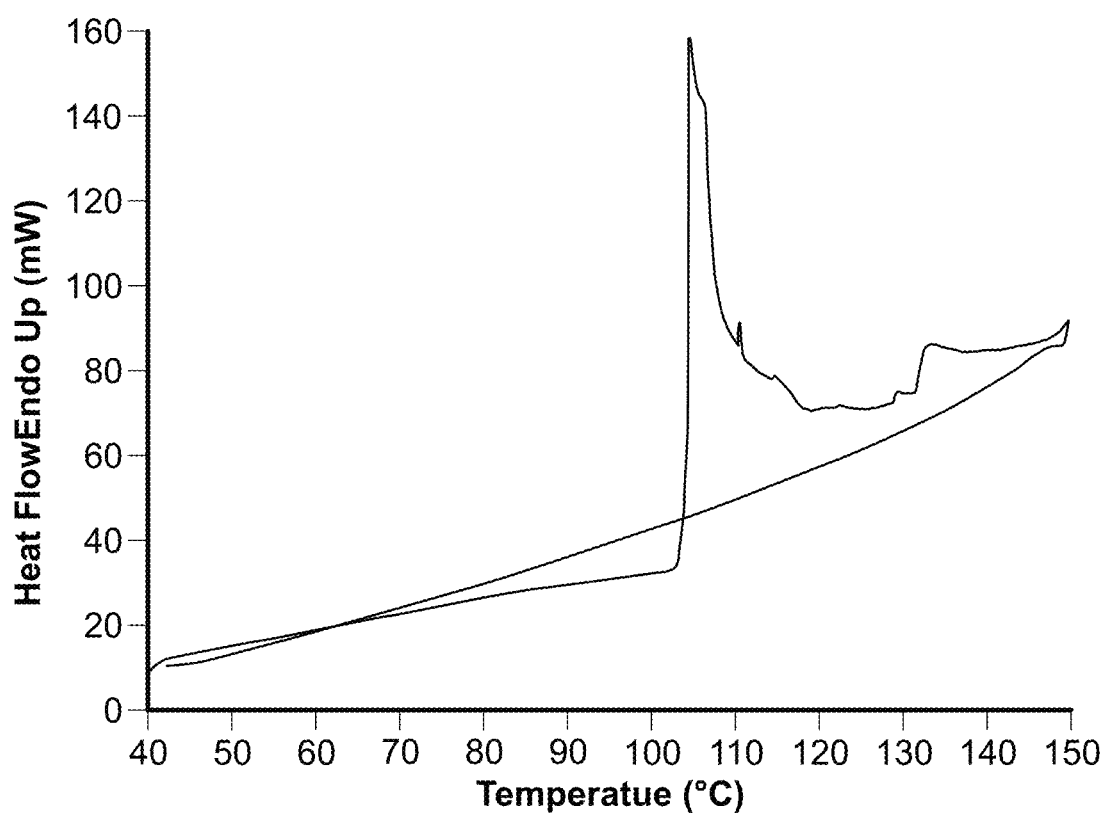
FIG. 25 shows the differential scanning calorimetry (DSC) plot of $C_7H_{10}O_4S$. The result indicates the presence of calamitic liquid crystalline phases.
Figure 26:
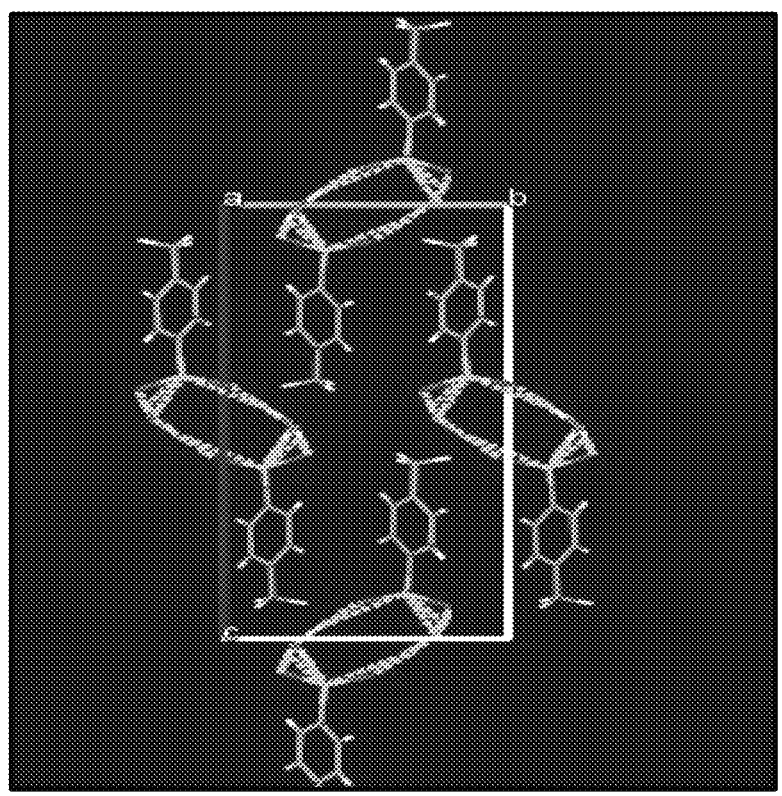
FIG. 26 shows the images of asymmetric unit (left) and Lattice structure of synthesized single crystal (right) ($C_7H_{10}O_4S$).
Figure 27:
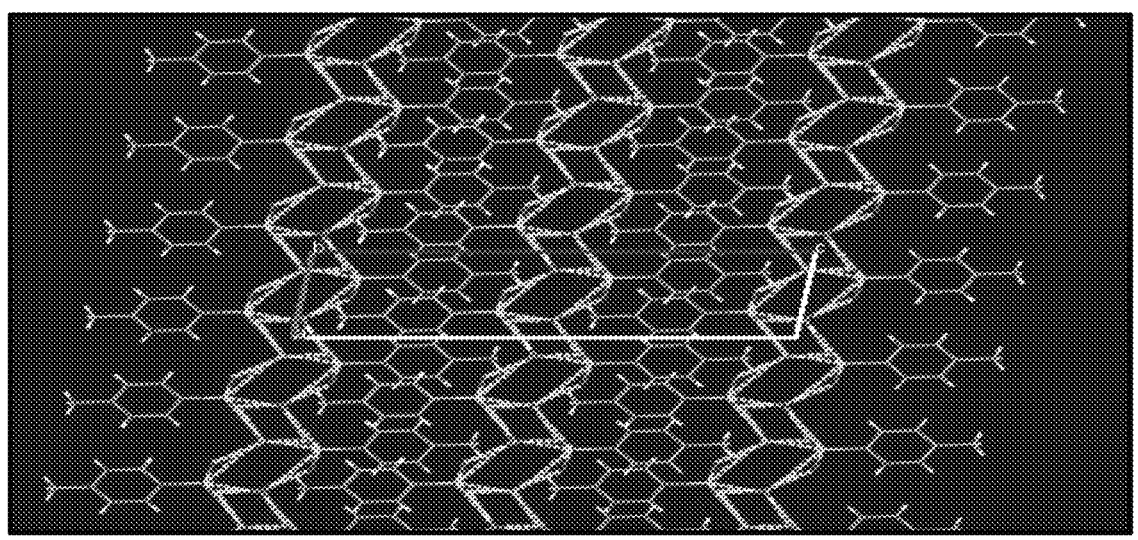
FIG. 27 shows the supramolecular assembly of $C_7H_{10}O_4S$ molecules when viewed down the axis of a section of the layers formed by S—H . . . O interactions between hydrogen atoms on the aromatic ring and the sulfonic groups on adjacent molecules.
Figure 28:
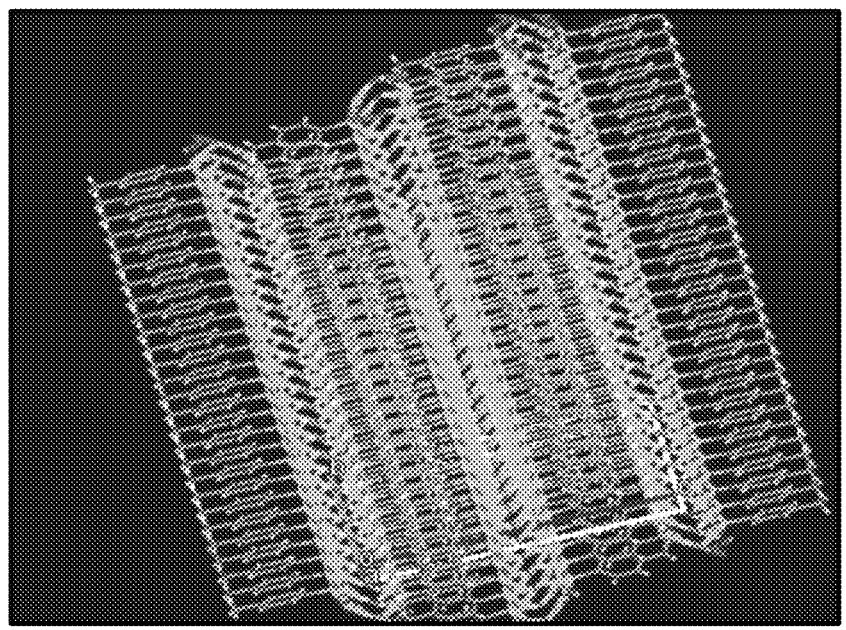
FIG. 28 shows the supramolecular assembly of a highly ordered hydrogen network of structure of $C_7H_{10}O_4S$ molecules. The structure demonstrates a possibility of a high strength alkyl sulfonic acid functionalized graphene material that exhibits a plastic or shock absorber like anisotropic structure.
Figure 29:
FIG. 29 shows the birefringence property of synthesized $C_7H_{10}O_4S$ when viewed under the polarizer.

Derivatization of Asphaltene 50 ml of equally mixed benzene and toluene were mixed with 50 ml of nitric acid and sulfuric acid (ratio 1:9 respectively) at 70±10° C., 200 mg of asphaltenes was added and refluxing was allowed for 3 days. The pH of the solution was controlled by neutralizing with 0.1 M NaOH at 90° C.±10° C. for 2 hours and quenching was completed with the addition of 0.1 M HCl at 90° C.±10° C. for 2 hours. Powder residues were filtered out under vacuum and the synthesis proceeded with the recrystallization of the remaining solution. The powder residue is analyzed as elastotene. The remaining solution was mixed with ethanol or a mixture of ethanol and diethyl at room temperature for 10-24 hours. The recovered solvent is analyzed as nitrobenzene derivative. The resulting crystal is a single crystalline graphene with an asymmetric unit that is modeled as 1,4 methyl sulfonic acid oxonium salt. It is a member of the P-Nimota. The birefringence behavior and DSC plot of this crystal is shown in FIG. 24 and FIG. 25, respectively. The asymmetric unit of this class of plastotene is shown in FIG. 22 and the structural information is provided by Cambridge Crystallographic Data Centre. The data have been assigned the deposition number: CCDC 1002531; Formula: C7H7O3S1 1−,H3O1 1+; Unit Cell Parameters: a 5.880(5) b 7.444(6) c 20.111(16) P21/c; molecular weight 190.21 gmol$^{-1}$.

Example 16

Derivatization of Asphaltene

Synthesis of a graphene material that is functionalized with alkyl sulfonic acid oxonium salt. 200 mg of asphaltene were dissolved in 50 ml benzene-toluene mixture and the resulting solution was immersed in 50 ml of sulfonic acid, the resulting suspension was exposed to microwave irradiation for 10 minutes. 0.001 molar concentration of NaOH was added to the resulting solution and the new mixture is exposed to microwave irradiation for 50 seconds thereafter. 0.001 molar concentration of HCl was added to the solution and the final mixture was exposed to microwave irradiation for 50 seconds. Separation of residues and the recrystallization of the dispersed solution in an ether-ethanol mixture was conducted. The separated residue is analyzed as elastotene powder and the crystalline product is a class of graphene nanoribbon, which is analyzed as P-Nimota. The recovered solvent is analyzed as benzene derivative.

Example 17

Derivatization of Asphaltene 50 ml of equally mixed benzene and toluene were mixed with 50 ml of Piranha solution [H$_2$SO$_4$/H$_2$O$_2$ (3:1)] at 80° C.±10° C., 200 mg of mechanically ball-milled asphaltene was added and refluxing was allowed for 3 days. The pH of the solution was controlled by neutralizing with 50 ml of 0.1M NaOH at 90° C.±10° C. for 2 hours and quenching was completed with the addition of 50 ml of 0.1 M HCl at 90° C.±10° C. for 2 hours. Powder residue was filtered under vacuum and the synthesis proceeded with the recrystallization of the remaining solution. The remaining solution was mixed with ethanol or a mixture of ethanol and diethyl at room temperature for 10-24 hours. The resulting crystal is a single crystalline graphene with an asymmetric unit that is. It belongs to P-Nimota.

Example 18

Derivatization of Asphaltene 200 mg of asphaltene was dissolved in 50 ml benzene and the resulting solution was immersed in an acidic mixture of 5 ml of nitric acid and 50 ml of sulfonic acid. The resulting suspension was exposed to microwave irradiation for 10 minutes. 0.001 molar concentration of NaOH was added to the resulting solution and the new mixture is exposed to microwave irradiation at 70° C. for between 10-20 minutes, 0.001 molar concentration of HCl was added to the solution and the final mixture was exposed to microwave irradiation at 70° C. for 10-20 minutes. The mixtures are separated by isolating the powder residue (plastotene powder) via filtration. The remaining mixtures are separated by centrifugation and extensively rinsed. The new product is a white precipitate. The precipitate is dried and purified with diethyl ether. The dried precipitate is a fibrous material that is analyzed as single crystal graphene material and named as E-Nimota crystals. The recovered solvent is analyzed as sulfonic derivatives.

When 200 mg of the isolated plastotene powder was dissolved in benzene and toluene and the solution was refluxed in a combination of nitric acid and sulfuric acid at 90° C.±10° C., for 3 days. The pH of the solution was controlled by neutralizing with 0.1 M NaOH at 90° C.±10° C. for 2 hours and quenching was completed with the addition of 0.1 M HCl at 90° C.±10° C. for 2 hours. Powder residues were filtered out under vacuum and the synthesis proceeded with the recrystallization of the remaining solution. The remaining solution was mixed with ethanol or a mixture of ethanol and diethyl at room temperature for 10-24 hours. The resulting crystal is a single crystalline graphene material that belongs to E-Nimota.

200 mg of elastotene powder residue was refluxed in the nitric acid and sulfuric acid mixture at 90° C.±10° C. for 3 days. The solution was modified by neutralizing with 0.1 M NaOH at 90° C.±10° C. for 2 hours and quenching was completed with the addition of 0.1 M HCl at 90° C.±10° C. for 2 hours. The new product belongs to the E-Nimota.

Example 19

Derivatization of Asphaltene 200 mg of asphaltene were dissolved in 50 ml of toluene and the resulting solution was immersed in an acidic mixture of 5 ml of nitric acid and 50 ml of sulfonic acid, the resulting suspension was exposed to microwave irradiation for 30 minutes at 70° C. 0.001 molar concentration of NaOH was added to the resulting solution and the new mixture is remaining exposed to microwave irradiation for 5 minutes at 90° C. thereafter, 0.001 molar concentration of HCl was added to the solution and the final mixture was exposed to microwave irradiation for 5 minutes at 90° C. The mixtures are separated by isolating the powder residue (plastotene powder) via filtration. The remaining mixtures are separated by centrifugation and extensive rinsing. The new product is a white precipitate. The precipitate is dried and purified with diethyl ether. The dried precipitate is a fibrous material that is analyzed as single crystal graphene material, it belongs to the E-Nimota in this invention. Furthermore, benzene and toluene were mixed with a combination of nitric acid and sulfuric acid at 90±10° C., 200 mg of plastotene powder was added and refluxing was allowed for 3 days. The pH of the solution was controlled by neutralizing with 0.1 M NaOH at 90° C.±10° C. for 2 hours and quenching was completed with the addition of 0.1 M HCl at 90° C.±10° C. for 2 hours. Powder residues were filtered out under vacuum and the synthesis proceeded with the recrystallization of the remaining solution. The remaining solution was mixed with ethanol or a mixture of ethanol and diethyl at room temperature for 10-24 hours. The resulting crystalline graphene material belongs to the P-Nimota.

Example 21

Derivatization of Asphaltene 50 ml equally mixed solvent containing toluene & benzene was refluxed in acidic mixture of 50 ml nitric acid and sulfonic acid (1:9) at 70° C. for 3 days. 50 ml of 0.001 M NaOH was added to the resulting solution and the new mixture is heated at 90° C. for 2 hours. 0.001 molar concentration of HCl was added to the solution and the final mixture was heated at 90° C. for 2 hours. The product of this synthesis is 1,4 methyl sulfonic acid oxonium salt. It is classified as a P-Nimota.

Example 22

Processing of Resin

Synthesis of material from resin. 200 mg of resin were dissolved in 50 ml benzene-toluene mixture and the resulting solution was refluxed in an acidic mixture of 5 ml of nitric acid and 50 ml of sulfonic acid at 70° C. for 3 days. 50 ml of 0.001 M NaOH was added to the resulting solution and the new mixture is heated at 90° C. for 2 hours. 0.001 molar concentration of HCl was added to the solution and the final mixture was heated at 90° C. for 2 hours. Separation of residues and the recrystallization of the dispersed solution in an ether-ethanol mixture was conducted.

Example 23

Liquid Crystalline Production 200 mg of hexabenzocoronene (HBC) were dissolved in 50 ml benzene-toluene mixture (1:9) and the resulting solution was refluxed in 50 ml of sulfonic acid at 70° C. for 3 days. 50 ml of 0.001 M NaOH was added to the resulting solution and the new mixture is heated at 90° C. for 2 hours. 0.001 molar concentration of HCl was added to the solution and the final mixture was heated at 90° C. for 2 hours. The reaction proceeded with separation of residues and recrystallization of the dispersed solution in an ether-ethanol mixture. The product of this synthesis is a liquid crystalline material with a terminal methyl sulfonic acid oxonium salt.

As it is stated in known arts, the purity of the product can be improved by vapor deposition process. Also a more ordered lattice structure may be obtained using chemical deposition method. Therefore this invention incorporates deposition methods of known Arts like chemical vapor deposition, thermal vapor deposition, etc.

I claim:

1. A composition comprising:
A network of on or more nanostructures having a d-spacing or interlayer distance of greater than 0.07 nm to less than or equal to 1.367 nm;
wherein the network comprises a lattice structure selected from the groups consisting of an orthorhombic system, a monoclinic system, and a triclinic system,
wherein the lattice structure is an asymmetric structural unit $(ASU)_n$, wherein n is greater than zero and the ASU is represented by a formula of $(C_xH_yF)$ wherein x=6 or 7, 3≤y≤6 and F is one or more functional groups selected from the groups consisting of one or more nitrogen groups, one or more sulfur groups, one or more hydroxyl groups, one or more OR groups, one or more NHOR groups, one or more halogen groups, one or more halide groups, one or more $NR_2$ groups, one or more $SO_3H$ groups, one or more sulfide groups, one or more azogroups, one or more sulfonate groups, one or more CN groups, one or more $CH_3$ groups, one or more $N_2O_4$ groups, one or more $O_3SH_3O$ groups, one or more $SO_2$ groups, one or more $NO_2$ groups, one or more $NR_3$ groups, one or more amide groups, one or more carbonyl groups, one or more oxygen groups, one or more ketone groups, one or more ester groups, one or more carboxyl groups, one or more alkyl groups, one or more acyl groups, one or more carboxylate groups, or combinations thereof.

2. The composition according to claim 1, wherein x=6 or 7, y=3 or 4, and F is a selection from $SO_3H$, $CH_3$, $N_2O_4$, $O_3SH_3O$ or any combination thereof.

3. The composition according to claim 1, wherein the network of one or more nanostructures further comprises a selection from the group consisting of a single layer network, a bi-layer network, a multi-layered network, a cluster network, a superlattice network, a cyclic network, an acyclic network, an anisotropic network, a network of single molecules, a main chain network, a cross-linked network, a non-covalent network, a covalent network, zig-zag network, arm-chair network, a uniaxial network, a crystalline network, a nanoporous network, cyclic network, acyclic network, a rod-like network, a disk-like network, a polymorphic network, a double bonded network, a single bonded network, a triple bonded network, acetylenic linked network, a self-assembled network, an atomically precise network, an organic framework, and any combination thereof.

4. A product comprising the composition as claimed in 1, the product is selected from the group consisting of a single layer material, a liquid crystal, a single crystal, a supercapacitor, a sensor, multifunctional material, a biomaterial, a pharmaceutical ingredient, a smart material, a bioimaging material, a printable material, an additive, a flexible material, a gel material, a nanocomposite, an electrode, an electronic material, an electrode, an ITO substitute, a functional material, a detection device, a semiconductor, a quantum material, a drug-delivery agent, a fluorescence material, a battery, a superconductor, a membrane, a light emitting material, a photonic material, a nano-gel, a nanobuds, a nano-ink, a diodes, an anode, a cathode, a supercapacitor, a quantum dot, a nanofiller, a transistor, an actuator, a metal hybrid, an anisotropic conductor, a desalinator, a cancer detector, a thermoelectric, a field effect transistor, an organic ferroelectric, a molecular packing material, a bioimaging material, an energy storage material, a hydrogen storage device, a biosensor device, a spintronic device, a smart material, a lasing device, a battery material, a light-emitting diode, or a combination thereof.

5. A composition comprising:
a network of one or more nanostructures having a d-spacing or interlayer distance of less than or equal to 1.367 nm,
wherein the network comprises a selection from the groups consisting of a crosslinked network, a zig-zag edge, an armchair edge, or any combination thereof,
wherein the nanostructures is selected from the groups consisting of 2D carbon allotropes, 0D carbon allotrope, or a 1D carbon allotrope, or any combination thereof,
wherein the network comprises a lattice structure selected from the groups consisting of orthorhombic system, a monoclinic system, or a triclinic system,
wherein the lattice structure is an asymmetric unit, $(ASU)_n$, wherein n>0,
wherein the ASU is represented by $(C_xH_yF)$, wherein x=6 or 7, 3≤y≤9 and F is one or more functional groups selected from the groups consisting of one or more nitrogen groups, one or more sulfur groups, one or more hydroxyl groups, one or more OR groups, one or more NHOR groups, one or more halogen groups, one or more halide groups, one or more $NR_2$ groups, one or more $SO_3H$ groups, one or more sulfide groups, one or more azogroups, one or more sulfonate groups, one or more CN groups, one or more $CH_3$ groups, one or more $N_2O_4$ groups, one or more $O_3SH_3O$ groups, one or more $SO_2$ groups, one or more $NO_2$ groups, one or more $NR_3$ groups, one or more amide groups, one or more carbonyl groups, one or more oxygen groups, one or more ketone groups, one or more ester groups, one or more carboxyl groups, one or more alkyl groups, one or more acyl groups, one or more carboxylate groups, or combinations thereof.

6. The composition according to claim 5, wherein the network further comprises a nanobubble material comprising a nanobud, one or more metals, and a plurality of functional groups.

7. The composition according to claim 5, further includes a nanocomposite material comprising a nanobud, one or more metals, and a plurality of functional groups.

8. The composition according to claim 5, further comprises fullerene composite having a plurality of functional groups.

9. The composition according to claim 5, further comprises a nanotube composite having a plurality of functional groups.

10. The composition according to claim 5, wherein the composition is a liquid crystal.

11. The composition according to claim 5, wherein the network further comprises a 2D carbon allotrope of graphene having a plurality of functional groups, wherein the functional groups are selected from the group containing an amide group, a carbonyl group, an oxygen group, an ester, a carboxyl group, an alkyl group, an acyl group, or a combination thereof.

12. The composition according to claim 5 wherein the network further comprises a 2D single crystalline carbon allotrope of graphene having an asymmetric unit formula of $C_7H_6N_2O_4$.

13. The composition according to claim 5, wherein the network further comprises a 2D single crystalline carbon allotrope of graphene having an asymmetric unit formula of $C_6H_4N_2O_4$.

14. The composition according to claim 5, wherein the network further comprises a 2D single crystalline carbon allotrope of graphene having an asymmetric unit formula of $C_7H_7O_3S^-H_3O^+$.

15. The composition according to claim 5, wherein the network further comprises a 2D single crystalline carbon allotrope of graphene having an asymmetric unit formula of $C_7H_7O_3SH^+$.

16. The composition of claim 5 wherein the composition is a quantum dot.

17. The composition according to claim 5, wherein the composition is a single crystal carbon allotrope.

18. A composition comprising:
  a supra molecular network comprising one or more 2D nanostructures comprising a lattice structure,
  wherein the lattice structure is selected from the groups consisting of an orthorhombic system, a monoclinic system, or a triclinic system;
  the lattice structure is an asymmetric unit $(ASU)_n$, and the ASU is represented by the formula $(Na_6S_{16}O_4)n$, wherein n is greater than 0.

19. The composition according to 18, wherein the network further comprises a 2D single crystal having an asymmetric unit $Na_6S_{16}O_4$.

20. A dispersant method for making the composition according to claim 1 or 18, comprising the steps of:
  providing an asphaltene composition;
  refluxing the asphaltene composition with one or more additives to form a refluxed solution;
  stirring at a temperature of at least room temperature for a predetermined period of time to form a reflux solution with one or more defects at a surface;
  adding a modifying agent to the refluxed solution to form a modified solution; and
  purifying the modified solution.

21. The dispersant method according to claim 20, further comprises quenching the modified solution with a separating agent that controls pH and facilitates the separation of polar compounds wherein a quenched solution is formed.

22. The dispersant method according to claim 21, wherein the quenched solution is purified.

23. The dispersant method according to claim 20, wherein the one or more additives are selected from the group consisting of one or more surfactants, one or more intercalating agents, one or more coupling agents, one or more catalysts, one or more acids, one or more oxidizing agents, one or more reducing agents, one or more solvents, one or more sulfonic acid derivatives, one or more composites, one or more hydrocarbons, one or more dispersing agents, or any combination thereof.

24. The dispersant method according to claim 20, wherein the modifying agent is selected from the group consisting of a metal catalyst, a basic solution, a reducing agent, a salt solution, one or more metal oxides, one or more sulfides, one or more hydrides or any combination thereof.

25. A dispersant/solvent method of making the composition according to claim 1, or 5, comprising the steps of:
  providing an asphaltene solvent solution; wherein the asphaltene solvent solution is a mixture of an asphaltene material and one or more solvents,
  refluxing the asphaltene solvent solution in a surfactant under a given period of time to form a reflux solution;
  adding a modifying agent to the reflux solution to form a modified solution;
  adding a pH controlling agent to form a reactive solution;
  quenching the reactive solution to form a quenched solution; and
  purifying the quenched solution.

26. The dispersant/solvent method according to claim 25, wherein the one or more solvents is selected from the group consisting of an organic solvents, a polar, a polar aprotic, apolar, an aromatic solvent, benzene, toluene, naphthalene, methanol, distilled water, dichloromethane, chloroform, xylene, dichlorobenzene, dimethylformide, tetrahydrofuran, chlorobenzene, dioxane, ethyl glycerol, alkanes, methylbenzene, ethyl benzene, isopropyl benzene, methyl naphthalene, dimethysulfoxide, isopropanol, tetrahydrofuran, dimethylformamide, carbon sulfide, 1,2 dichloromethane, acetone, tetrachloromethane, sulfur trioxide, chloroform, dichlorobenzene, or any mixtures thereof.

27. An asphaltene derivation method for making the composition according to claim 1, 5 or 18 comprising the steps of:
  providing an asphaltene composition;
  performing a processing step selected from the groups consisting of fractionating the asphaltene composition, purifying the asphaltene composition, derivatizing the asphaltene composition, or functionalizing the asphaltene composition to thereby form an asphaltene derivative or an asphaltene product;
  modifying the asphaltene derivative or the asphaltene product by contact with one or more modifying agents; and
  isolating or purifying the asphaltene product or the asphaltene derivative.

28. The asphaltene derivatization method according to claim 27, wherein the asphaltene composition is a mixture comprising an asphaltene or a starting material and one or more additives at a predetermined temperature for a predetermined period of time.

29. The asphaltene derivatization method according to claim 27, further comprising a starting material selected from the group consisting of a layered material, a stacked material, an asphaltene, a two dimensional material, molybdenum sulfide, boron nitride, a carbon slurry, a graphitic compound, a soot, a lignite, a peat, a PAR compounds, a resin, a graphite, a petrified oil, an asphalt, a bitumen, a modified bitumen, a coal, a modified coal, a modified asphaltene, an anthracite, a modified anthracite or any combinations thereof.

30. The asphaltene derivatization method according to claim 27, wherein the derivatizing comprises performing one or more process steps selected from the group consisting of aromatization, functionalization, surface modification, dimerization, electrophilic aromatic substitution, nucleophilic aromatic substitution, desymmetrizing, hydrogenation, nitration, diazotization, Friedel crafts reaction, coupling, Sandmeyer reaction, sulfonation, halogenation, recrystallization, esterification, reduction, oxidation, or any combinations thereof.

31. The asphaltene derivatization method according to claim 27, wherein the modifying further includes a processing step selected from the group consisting of contacting with a modifying agent, forming a stable layer, increasing a surface area, changing structural dimension removing of barriers, adding one or more functional groups, substituting one or more functional groups, eliminating one or more functional groups, controlling pH, or any combination thereof.

32. The asphaltene derivatization method according to claim 27, wherein the one or more additives are selected from the group consisting of one or more hydrocarbons, one or more polar solvents, one or more apolar solvents, one or more oxidants, one or more surfactants, one or more dispersants, one or more intercalating agents, one or more coupling agents, one or more catalysts, one or more acids, one or more oxidizing agents, one or more reducing agents, one or more solvents, one or more sulfonic acid derivatives, one or more composites, one or more dispersing agents, one or more polymers, one or more biological molecules, one or more heteroatom containing surfactants, one or more mixed acids, one or more antifoulants, one or more coagulants, one or more flocculants, one or more solubilizing agents, one or more antifoaming agent, one or more emulsifying agents, one or more ionic liquids, salts, one or more amphiphilic solvents, one or more dispersants, one or more acidic solution, DNA, one or more protein molecules, one or more aromatic solvents, one or more alkanes, one or more acidic ionic liquids, or any mixture thereof.

33. The asphaltene derivatization method according to claim 27, wherein the one or more modifying agents is selected from a metal catalyst, a basic solution, a reducing agent, a salt solution, a metal oxide, a sulfide, a hydride, sodium chloride, sodium hydroxide, ammonium hydroxide, hydrochloric acid, tetrahydrofuran, amino triazole, dimethylformamide, dimethylsulfoxide, phosphines, phosphites, sulfites, sulfides, hydrosulfites, borohydrides, boranes, hydroxylamine, lithium alhydride, sodium nitrite, hydrochloric acid, copper bromide, copper cyanide, potassium iodide, borohydrides, hydrochloric acid, cyanoborohydrides, aluminum hydrides, hydroquininone, hydrogen dimethylhydrazine, N,N-dimethylhydroxylamine, methylamine, dioxane, amino acids, dimethylamine, trimethylamine taurine, methionine, potassium hydroxide, tin, methanol, alkali sulfide, distilled water, or mixtures thereof.

34. The asphaltene derivatization method according to claim 27, further comprises a processing step selected from the group consisting of a hydrothermal process, a solvothermal process, a separation technique, recrystallization, a continuous flow reaction, a covalent interaction, non-covalent interaction, or a combination thereof.

35. A recycling method for making the composition according to claim 5, the method comprising:
   providing a mixture comprising an asphaltene composition and one or more additives;
   refluxing the mixture to obtain a refluxed solution; separating the refluxed solution into one or more phases of a solid powder and a continuous phase and forming a controlled solution by contacting the continuous phase with one or more controlling agents or forming an assembled solution by contacting the refluxed solution with one or more modifying agents;
   separating the controlled solution or the assembled solution into phases of powder residue and a continuous phase;
   recrystallizing the assembled solution or the continuous phase of form the composition or claim 5 and a benzene derivative; and
   recycling the benzene derivative.

36. The recycling method according to claim 35, wherein the asphaltene composition is selected from the group consisting of a protonated asphaltene composition, an oxidized asphaltene composition, a fractionated asphaltene, a mixed asphaltene, an unfractionated asphaltene, a metallized asphaltene, de-metalized asphaltene, a modified asphaltene, an asphaltene solution, a refluxed asphaltene composition, a modified solution, a controlled solution, a crude asphaltene composition, a thermally treated asphaltenes, a milled asphaltene, a mechanically treated asphaltene, and a thermomechanically treated asphaltene.

37. The recycling method according to claim 35, further comprises a processing step selected from the group consisting of hydrothermal, chemisorption, physisorption, intercalating, forming a benzene derivative, conjugating, performing one or more deposition technique, solvothermal, depositing the asphaltene product, or a combination thereof.

38. The recycling method according to claim 35, wherein the one or more additives is selected from the group consisting of one or more heteroatom containing surfactants, one or more benzene derivatives, one or more acids, one or more mixed acids, one or more solvents, one or more organic solvents, one or more antifoulants, one or more coagulants, one or more one or more flocculants, one or more solubilizing agents, one or more antifoaming agent, one or more emulsifying agents, one or more dispersing agents, one or more ionic liquids, salts, one or more oxidizing agents, one or more reducing agents, one or more catalysts, one or more amphiphilic solvents, one or more dispersants, one or more oxidants, acids, one or more polymers, one or more copolymers, one or more biological macromolecules, one or more acidic solutions, one or more DNA, one or more protein molecules, one or more polar solvents, one or more non-polar solvents, one or more aromatic solvents, water, one or more alcohols, one or more alkanes, one or more acidic ionic liquids and combinations thereof.

39. The recycling method according to claim 35, wherein the controlling agent is selected from hydrochloric acid, sodium bicarbonate, methanol, dimethyl sulfoxide, sodium hydroxide, potassium hydroxide, tetrahydrofuran, dimethylformamide, alkali sulfide, dimethylsulfoxide, phosphines, phosphites, sulfites, sulfides, dioxane, hydrosulfites, borohydrides, boranes, distilled water, sodium bicarbonate or mixtures thereof.

40. The recycling method according to claim 35, wherein the modifying agent is selected from a metal catalyst, a basic solution, a reducing agent, a salt solution, a metal oxide, a sulfide, a hydride, sodium chloride, sodium hydroxide, ammonium hydroxide, hydrochloric acid, tetrahydrofuran, amino triazole, dimethylformamide, dimethylsulfoxide, phosphines, phosphites, sulfites, sulfides, hydrosulfites, borohydrides, boranes, hydroxylamine, lithium alhydride, sodium nitrite, hydrochloric acid, copper bromide, copper cyanide, potassium iodide, borohydrides, hydrochloric acid, cyanoborohydrides, aluminum hydrides, hydroquininone, hydrogen dimethylhydrazine, N,N-dimethylhydroxylamine, methylamine, dioxane, amino acids, dimethylamine, trimethylamine taurine, methionine, potassium hydroxide, tin, methanol, alkali sulfide, distilled water, or mixtures thereof.

41. The dispersant/solvent method according to claim 25, wherein the modifying agent is selected from a metal catalyst, a basic solution, a reducing agent, a salt solution, a metal oxide, a sulfide, a hydride, sodium chloride, sodium hydroxide, ammonium hydroxide, hydrochloric acid, tetrahydrofuran, amino triazole, dimethylformamide, dimethylsulfoxide, phosphines, phosphites, sulfites, sulfides, hydrosulfites, borohydrides, boranes, hydroxylamine, lithium alhydride, sodium nitrite, hydrochloric acid, copper bromide, copper cyanide, potassium iodide, borohydrides, hydrochloric acid, cyanoborohydrides, aluminum hydrides, hydroquininone, hydrogen dimethylhydrazine, N,N-dimethylhydroxylamine, methylamine, dioxane, amino acids, dimethylamine, trimethylamine taurine, methionine, potassium hydroxide, tin, methanol, alkali sulfide, distilled water, or mixtures thereof.

42. A composition comprising:
   a network of one or more 2D nanostructures having a d-spacing or interlayer distance of greater than 0.07 nm to less than or equal to 1.367 nm,
   wherein the network comprises a lattice structure selected from the groups consisting of an orthorhombic system, a monoclinic system, or a triclinic system,
   wherein the lattice structure is an asymmetric structural unit, $(ASU)_n$ wherein $n>0$ and the asymmetric structural unit is represented by the formula $(C_XH_YF)$ where $x=6$ or $7$, $3 \leq y \leq 9$ and F is one or more functional groups selected from the groups consisting of one or more nitrogen groups, one or more sulfur groups, one or more hydroxyl groups, one or more OR groups, one or more NHOR groups, one or more halogen groups, one or more halide groups, one or more $NR_2$ groups, one or more $SO_3H$ groups, one or more sulfide groups, one or more azo groups, one or more sulfonate groups, one or more CN groups, one or more $CH_3$ groups, one or more $N_2O_4$ groups, one or more $O_3SH_3O$ groups, one or more $SO_2$ groups, one or more $NO_2$ groups, one or more $NR_3$ groups, one or more amide groups, one or more carbonyl groups, one or more oxygen groups, one or more ketone groups, one or more ester groups, one or more carboxyl groups, one or more alkyl groups, one or more acyl groups, one or more carboxylate groups, or combinations thereof.

43. A composition comprising:

w network structure having a d-spacing or interlayer distance of less than or equal to 1.367 nm, wherein the network comprises one or more 1D carbon nanostructures, wherein the network structure comprises a lattice structure selected from the groups consisting of an orthorhombic system, a monoclinic system, or a triclinic system and the lattice structure is an asymmetric structural unit $(ASU)_n$ where n>0, and the lattice structure is $(C_xH_yF)$, where x is 6 or 7, $3 \leq y \leq 6$ and F is one or more functional groups selected from the groups consisting of one or more nitrogen groups, one or more sulfur groups, one or more hydroxyl groups, one or more OR groups, one or more NHOR groups, one or more halogen groups, one or more halide groups, one or more $NR_2$ groups, one or more $SO_3H$ groups, one or more sulfide groups, one or more azo groups, one or more sulfonate groups, one or more CN groups, one or more $CH_3$ groups, one or more $N_2O_4$ groups, one or more $O_3SH_3O$ groups, one or more $SO_2$ groups, one or more $NO_2$ groups, one or more $NR_3$ groups, one or more amide groups, one or more carbonyl groups, one or more oxygen groups, one or more ketone groups, one or more ester groups, one or more carboxyl groups, one or more alkyl groups, one or more acyl groups, one or more carboxylate groups, or combinations thereof.

44. A composition comprising:

a network structure having a d-spacing or interlayer distance of less than or equal to 1.367 nm, wherein the network comprises one or more 0D carbon nanostructures, herein the network structure comprises a lattice structure selected from the groups consisting of an orthorhombic system, a monoclinic system, or a triclinic system and the lattice structure is an asymmetric structural unit $(ASU)_n$ where n>0, and the lattice structure is $(C_xH_yF)$, where x is 6 or 7, $3 \leq y \leq 6$ and F is one or more functional groups selected from the groups consisting of one or more nitrogen groups, one or more sulfur groups, one or more hydroxyl groups, one or more OR groups, one or more NHOR groups, one or more halogen groups, one or more halide groups, one or more $NR_2$ groups, one or more $SO_3H$ groups, one or more sulfide groups, one or more azo groups, one or more sulfonate groups, one or more CN groups, one or more $CH_3$ groups, one or more $N_2O_4$ groups, one or more $O_3SH_3O$ groups, one or more $SO_2$ groups, one or more $NO_2$ groups, one or more $NR_3$ groups, one or more amide groups, one or more carbonyl groups, one or more oxygen groups, one or more ketone groups, one or more ester groups, one or more carboxyl groups, one or more alkyl groups, one or more acyl groups, one or more carboxylate groups, or combinations thereof.

* * * * *

UNITED STATES PATENT AND TRADEMARK OFFICE
CERTIFICATE OF CORRECTION

Page 1 of 1

PATENT NO. : 11,479,466 B2
APPLICATION NO. : 14/822822
DATED : October 25, 2022
INVENTOR(S) : Olanrewaju W Tanimola It is certified that error appears in the above-identified patent and that said Letters Patent is hereby corrected as shown below:

In the Claims

Column 38 Line 58 Claim 1:
Delete "A network of on"
Insert --A network of one--

Signed and Sealed this
Twenty-seventh Day of August, 2024

Katherine Kelly Vidal
*Director of the United States Patent and Trademark Office*